(12) United States Patent
Lee

(10) Patent No.: US 10,460,774 B2
(45) Date of Patent: Oct. 29, 2019

(54) APPARATUS AND METHOD CAPABLE OF REMOVING DUPLICATION WRITE OF DATA IN MEMORY

(71) Applicant: SK hynix Inc., Gyeonggi-do (KR)

(72) Inventor: Dong-Sop Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 221 days.

(21) Appl. No.: 15/607,148

(22) Filed: May 26, 2017

(65) Prior Publication Data

US 2018/0090184 A1    Mar. 29, 2018

(30) Foreign Application Priority Data

Sep. 28, 2016 (KR) .................. 10-2016-0124551

(51) Int. Cl.
| | | |
|---|---|---|
| *G11C 7/10* | (2006.01) | |
| *G06F 12/1018* | (2016.01) | |
| *G06F 13/16* | (2006.01) | |
| *G11C 29/10* | (2006.01) | |
| *G11C 29/20* | (2006.01) | |
| *G11C 29/00* | (2006.01) | |

(52) U.S. Cl.
CPC ........ *G11C 7/1006* (2013.01); *G06F 12/1018* (2013.01); *G06F 13/1684* (2013.01); *G11C 7/109* (2013.01); *G11C 7/1048* (2013.01); *G11C 29/10* (2013.01); *G11C 29/20* (2013.01); *G11C 29/74* (2013.01); *G06F 2212/1044* (2013.01); *Y02D 10/13* (2018.01); *Y02D 10/14* (2018.01)

(58) Field of Classification Search
None
See application file for complete search history.

(56) References Cited

U.S. PATENT DOCUMENTS

| | | | | |
|---|---|---|---|---|
| 10,019,459 B1* | 7/2018 | Agarwala | ........... | G06F 12/0253 |
| 2014/0115258 A1* | 4/2014 | Week | .................. | G06F 16/1752 |
| | | | | 711/133 |
| 2014/0115260 A1* | 4/2014 | Maybee | .............. | G06F 12/0866 |
| | | | | 711/136 |
| 2014/0188819 A1* | 7/2014 | Bagal | .................. | G06F 16/1748 |
| | | | | 707/692 |
| 2014/0297980 A1 | 10/2014 | Yamazaki | | |

FOREIGN PATENT DOCUMENTS

| | | |
|---|---|---|
| KR | 101229851 | 2/2013 |
| KR | 1020140141348 | 12/2014 |

* cited by examiner

*Primary Examiner* — Kevin Verbrugge
(74) *Attorney, Agent, or Firm* — IP &T Group LLP

(57) ABSTRACT

This technology relates to a memory control apparatus for processing data into a memory device and an operating method of the memory control apparatus. A method for controlling a memory may include converting received program data with a first address into compressed data, searching a deduplication table including compressed data, a second address of a memory device in which non-compressed data corresponding to the compressed data has been written and a counter indicative of the write number of the data for the converted compressed data, and if the converted compressed data is searched for in the deduplication table, mapping a second address corresponding to the compressed data in the deduplication table to the first address, not performing a write operation of the memory device for the received program data, and updating the deduplication table.

14 Claims, 22 Drawing Sheets

FIG. 10A

| Command | | Operation | Completion |
|---|---|---|---|
| Write-DUPLICATION | CDW10, CDW11, CDW12, CDW13, CDW14, CDW15, Metadata Pointer, PRP Entry 1, PRP Entry 2, or Metadata SGL Segment Pointer, SGL Entry 1 | Write data and metadata.<br>-CDW11.SLBA:<br>-CDW12.LR:<br>-CDW12.FUA:<br>-CDW12.PRINFO:<br>-CDW12.NLB:<br>-CDW13.DSM:Dataset Management<br>-CDW14.ILBRT:<br>-CDW14.LBATM:<br>-CDW14.LBAT: | Command Specified Status Values<br>- 80h: Conflicting Attributes<br>- 81h: Invalid Protection Information<br>- 82h: Attemped Write to Read Only Range |

FIG. 10B

| Opcode(7) Generic Command | Opcode(6:2) Function | Opcode(1:0) Data Transfer | Opcode | O/M | Namespace Identifier Used | Command | |
|---|---|---|---|---|---|---|---|
| 0b | 000 00b | 00b | 00h | M | YES | Flush | |
| 0b | 000 00b | 01b | 01h | M | YES | Write | |
| 1b | 000 00b | 01b | 01h | M | YES | Write-DUPLICATION | PROPOSED METHOD |
| 0b | 000 00b | 10b | 02h | M | YES | Read | |
| 0b | 000 01b | 00b | 04h | O | YES | Write Uncorrectable | |
| 0b | 000 01b | 01b | 05h | O | YES | Compare | |
| 0b | 000 10b | 00b | 08h | O | YES | Write Zeroes | |
| 0b | 000 10b | 01b | 09h | O | YES | Dataset Management | |
| 0b | 000 11b | 01b | 0Dh | O | YES | Reservation Register | |
| 0b | 000 11b | 10b | 0Eh | O | YES | Reservation Report | |
| 0b | 001 00b | 01b | 11h | O | YES | Reservation Acquire | |
| 0b | 001 01b | 01b | 15h | O | YES | Reservation Release | |
| 1b | na | na | 80h - FFh | O | YES | Vendor specific | |

FIG. 10C

Figure 196: Write - Command Dword 13

| Bit | Description |
|---|---|
| 31:08 | Reserved |
| 07:00 | Dataset Management (DSM): This field indicates attributes for the dataset that the LBA(s) being read are associated with

| Bit | Attribute | Definition |
|---|---|---|
| 07 | Incompressible | If set to '1', then data is not compressible for the logical blocks indicated. If cleared to '0', then no information on compression is provided. |
| 06 | Sequential Request | If set to '1', this command is part of a sequential write that includes multiple Write commands. If cleared to '0', then no information on sequential access is provided. |
| 05:04 | Access Latency | <table><tr><th>Value</th><th>Definition</th></tr><tr><td>00b</td><td>None. No latency information provided.</td></tr><tr><td>01b</td><td>Idle. Longer latency acceptable.</td></tr><tr><td>10b</td><td>Normal. Typical latency.</td></tr><tr><td>11b</td><td>Low. Smallest possible latency.</td></tr></table> |
| 03:00 | Access Frequency | <table><tr><th>Value</th><th>Definition</th></tr><tr><td>0000b</td><td>No frequency information provided.</td></tr><tr><td>0001b</td><td>Typical number of reads and writes expected for this LBA range.</td></tr><tr><td>0010b</td><td>Infrequent writes and infrequent reads to the LBA range indicated.</td></tr><tr><td>0011b</td><td>Infrequent writes and frequent reads to the LBA range indicated.</td></tr><tr><td>0100b</td><td>Frequent writes and infrequent reads to the LBA range indicated.</td></tr><tr><td>0101b</td><td>Frequent writes and frequent reads to the LBA range indicated.</td></tr><tr><td>0110b</td><td>One time write. E.g. command is due to virus scan, backup, file copy, or archive.</td></tr><tr><td>0111b-1111b</td><td>Reserved</td></tr></table> |
|

APPARATUS AND METHOD CAPABLE OF REMOVING DUPLICATION WRITE OF DATA IN MEMORY

CROSS-REFERENCE TO RELATED APPLICATION

The present application claims priority of Korean Patent Application No. 10-2016-0124551, filed on Sep. 28, 2016, which is incorporated herein by reference in its entirety.

BACKGROUND

1. Field

Exemplary embodiments of the present invention relate to an apparatus and method for controlling memory, and, more particularly, to an apparatus and method capable of removing the duplication write of data.

2. Description of the Related Art

Recently, the paradigm of the computer environment is changed into a ubiquitous computing environment which allows users to get access to a computer system anywhere and anytime. For this reason, use of portable electronic devices, such as mobile phones, digital cameras, laptop computers and the like, is surging. Portable electronic devices generally employ a memory system using a memory device for storing data. A memory system, also referred to as a data storage device, may be used as a main memory device or an auxiliary memory device of a portable electronic device.

A memory system using a memory device has excellent stability and durability because it does not include a mechanical driving unit. Also, a memory system using a memory device is advantageous in that it may access data faster and consume less power. Non-limiting examples of a memory system having these advantages include a Universal Serial Bus (USB) memory device, a memory card with various interfaces, a Solid-State Drive (SSD) and so forth.

In a memory system, to write data means to store data in a memory cell of a memory device. For example, in a solid state drive (SSD) device, a write command received from a host may be executed by writing, i.e., storing data in a memory device. Each write operation may reduce the lifespan of the memory device because of abrasion. For example, the write number of a non-volatile memory device (e.g., NAND flash) may correspond to the lifespan of the memory device.

Typically, heretofore, a minimum unit of data stored in one location of a memory device may be duplicated, meaning it may also be stored in another location of the memory device.

SUMMARY

Various embodiments are directed to a memory system capable of determining the duplication of data written in a memory device and removing a write operation for duplicated data and an operating method thereof.

Also, various embodiments are directed to a memory system, which includes compressed data and a deduplication table for storing information about an address of a memory device at which the compressed data is stored and which is capable of determining whether data to be written is duplicated or not by searching the deduplication table for the data in a data write operation and of removing a write operation for the duplicated data, and a method for the memory system.

In an embodiment, a memory device may include a memory device and a controller functionally coupled to the memory device. The controller may include a deduplication table for storing compressed data, a second address of the memory device in which non-compressed data corresponding to the compressed data has been written and a count value indicative of a write number of the data. The controller may compress program data of a first address received in a data write operation, may search for the compressed data in the deduplication table and if the compressed data is searched for in the deduplication table, may map a second address corresponding to the compressed data to the first address in the deduplication table, and may not perform a write operation of the memory device for the received program data.

In an embodiment, an apparatus for controlling a memory device may include a memory device and a controller functionally coupled to the memory device. The controller may include a deduplication table for storing lossless compressed data and a second address of the memory device in which non-compressed data corresponding to the lossless compressed data is stored. The controller may lossless compress received program data with a first address and if the lossless compressed data is searched for in the deduplication table, may map a second address of the retrieved lossless compressed data to the first address and may not write the program data in the memory device.

In an embodiment, a method for controlling memory may include converting received program data with a first address into compressed data, searching a deduplication table including compressed data, a second address of a memory device in which non-compressed data corresponding to the compressed data has been written and a counter indicative of the write number of the data for the converted compressed data, and if the converted compressed data is searched for in the deduplication table, mapping a second address corresponding to the compressed data in the deduplication table to the first address, not performing a write operation of the memory device, and updating the deduplication table.

BRIEF DESCRIPTION OF THE DRAWINGS

FIGS. 10A to 10C are diagrams showing examples of commands for registering, by the memory system, frequently used patterns with the deduplication table, in accordance with various embodiments of the present invention.

DETAILED DESCRIPTION

Figure 1:
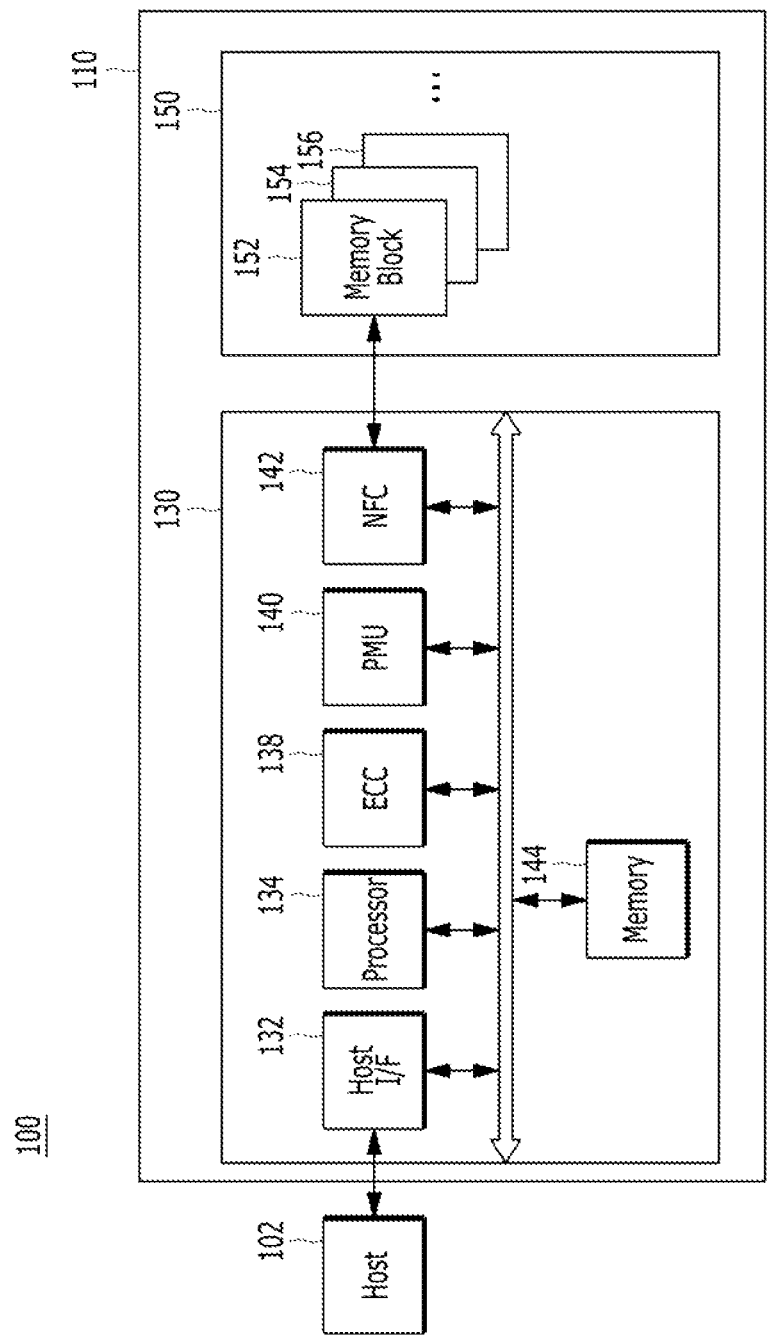
FIG. 1 is a block diagram illustrating an example of a data processing system including a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

A memory system in accordance with various embodiments of the present invention may determine whether data to be written is duplicated or not, and may manage only information about an address of a memory device in which the duplicated data has been written without storing the duplicated data in the memory device if, as a result of the determination, it is determined that the data to be written is duplicated. Various embodiments of the present invention propose a memory system capable of reducing the write influence (or write amplification influence) of duplicated program data and an operating method thereof.

Hereinafter, the various embodiments of the present invention will be described in detail with reference to the attached drawings.

FIG. 1 illustrates a data processing system 100 including a memory system 110, according to an embodiment of the present invention.

Referring to FIG. 1, the data processing system 100 may include a host 102 operatively coupled to the memory system 110.

The host 102 may be any suitable electronic device. The host 102 may be or include, for example, a portable electronic device such as a mobile phone, an MP3 player and a laptop computer or a non-portable electronic device such as a desktop computer, a game player, a television (TV) and a projector.

The memory system 110 may operate in response to a request from the host 102. For example, the memory system 110 may store data provided by the host 102 and the memory system 110 may also provide stored data to the host 102. Data which are stored in the memory system may be accessed by the host 102. The memory system 110 may be used as a main memory or an auxiliary memory of the host 102. The memory system 110 may be implemented with any one of various storage devices, according to the protocol of a host interface to be coupled electrically with the host 102. The memory system 110 may be implemented with any one of various storage devices, such as, for example, a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices forming the memory system 110 may be implemented with a volatile memory device, such as, a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase-change RAM (PRAM), a magnetoresistive RAM (MRAM), a resistive RAM (RRAM) and a flash memory.

The memory system 110 may include a memory device 150 and a controller 130. The memory device 150 may store data which may be accessed by the host 102. The controller 130 may control data exchange between the memory device 150 and the host 102. For example, under the control of the controller 130, data received from the host 102 may be stored in the memory device 150, and stored data in the memory device 150 may be read and transmitted to the host 102.

The controller 130 and the memory device 150 may be integrated into one semiconductor device. For instance, the controller 130 and the memory device 150 may be integrated into one semiconductor device to form a solid state drive (SSD). When the memory system 110 is used as an SSD, the operation speed of the host 102 that is electrically coupled with the memory system 110 may be significantly increased.

The controller 130 and the memory device 150 may be integrated into one semiconductor device to form a memory card, such as, for example, a Personal Computer Memory Card International Association (PCMCIA) card, a compact flash (CF) card, a smart media card (SMC), a memory stick, a multimedia card (MMC), an RS-MMC, a micro-MMC, a secure digital (SD) card, a mini-SD, a micro-SD, an SDHC, and a universal flash storage (UFS) device.

The memory device 150 may retain stored data even when power is blocked, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells which are electrically coupled to a word line (WL). The memory cells may be single bit cells or multi-bit cells. The memory cells may be arranged in a two or three dimensional stacked structure. The memory device 150 may be a nonvolatile memory device, for example, a flash memory. The flash memory may have a three-dimensional (3D) stack structure.

For example, the controller 130 may include a host interface (I/F) unit 132, a processor 134, an error correction code (ECC) unit 138, a power management unit (PMU) 140, a NAND flash controller (NFC) 142, and a memory 144.

The host interface unit 132 may process commands and data provided from the host 102, and may communicate with the host 102 through at least one of various interface protocols such as universal serial bus (USB), multimedia card (MMC), peripheral component interconnect express (PCI-e), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than a threshold number of correctable error bits, and may output an error correction fail signal indicating failure in correcting the error bits.

The ECC unit 138 may perform an error correction operation based on any suitable method including a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory. It is noted that a different memory interface may be employed depending upon the type of memory device employed.

The memory 144 may serve as a working memory of the memory system 110 and the controller 130. The memory 144 may store data for driving the memory system 110 and the controller 130. The controller 130 may control the memory device 150 in response to a request from the host 102. For example, the controller 130 may provide data read from the memory device 150 to the host 102 and store the data provided from the host 102 in the memory device 150. When the controller 130 controls an operation of the memory device 150, for example, a read, write, program and erase operation, the memory 144 may store data which are used by the controller 130 and the memory device 150 for the operation.

The memory 144 may be implemented with a volatile memory such as a static random access memory (SRAM) or a dynamic random access memory (DRAM). As described above, the memory 144 may store data used by the host 102 and the memory device 150 for an operation including a read and a write operation. For storing the data, the memory 144 may include a program memory, a data memory, a write buffer, a read buffer, a map buffer, and the like.

The processor 134 may control the general operations of the memory system 110, and a write operation or a read operation for the memory device 150, in response to a write request or a read request received from the host 102, respectively. For example, the processor 134 may drive firmware, which is referred to as a flash translation layer (FTL), to control the general operations of the memory system 110. The processor 134 may be implemented, for example, with a microprocessor or a central processing unit (CPU).

Figure 2:
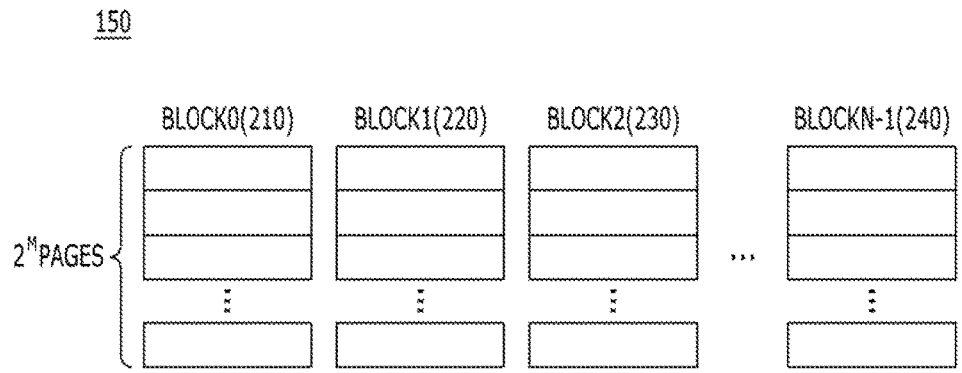
FIG. 2 illustrates a memory device in a memory system in accordance with an embodiment of the present invention.
Figure 3:
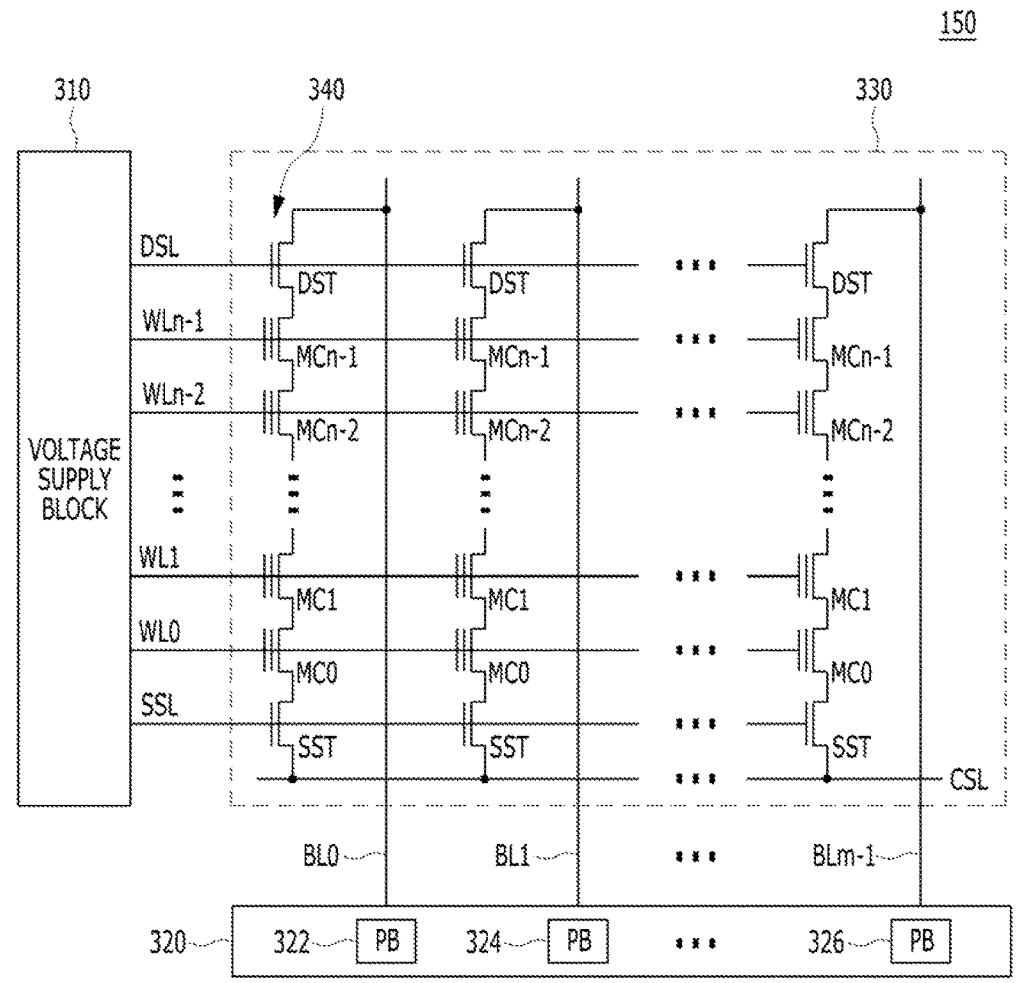
FIG. 3 is a diagram illustrating a memory cell array circuit of memory blocks in a memory device in accordance with an embodiment of the present invention.
Figure 4:
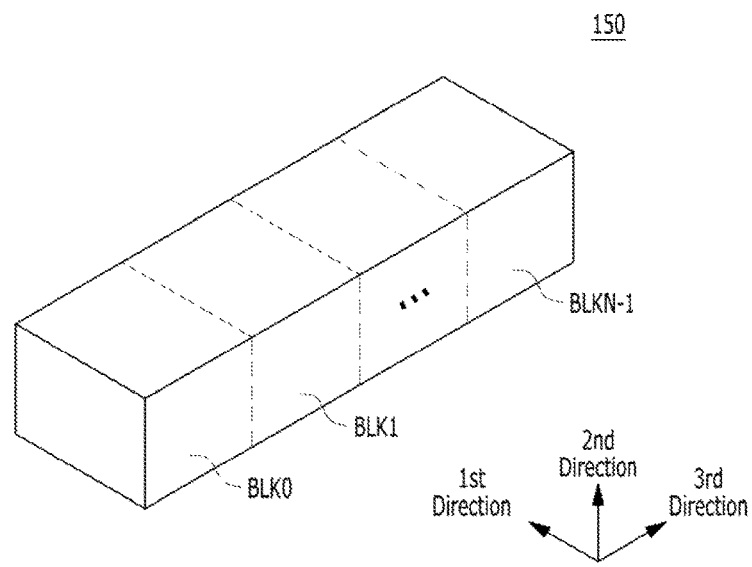
FIG. 4 illustrates a structure of a memory device in a memory system in accordance with an embodiment of the present invention.

FIG. 2 illustrates an example of a memory device in a memory system in accordance with an embodiment of the present invention. FIG. 3 is a schematic diagram illustrating a memory cell array circuit of memory blocks in a memory device in accordance with an embodiment of the present invention. FIG. 4 illustrates a structure of a memory device in a memory system in accordance with an embodiment of the present invention, and shows that the memory device may be realized as a 3-dimensional non-volatile memory device.

Referring to FIG. 2, the memory device 150 may include a plurality of memory blocks. For example, the memory device 150 may include a zeroth memory block (BLOCK0) 210, a first memory block (BLOCK1) 220, a second memory block (BLOCK2) 230 and an N-1th memory block (BLOCKN-1) 240. Each of the memory blocks 210 to 240 may include a plurality of pages, for example, $2^M$ number of pages ($2_M$ PAGES). Each of the pages may include a plurality of memory cells which are electrically coupled to a word line.

Also, the memory device 150 may include a plurality of memory blocks, as single level cell (SLC) memory blocks and/or multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may also be referred to as a triple level cell (TLC) memory block.

Each of the memory blocks 210 to 240 may store the data provided from the host 102 during a write operation, and provide the stored data to the host 102 during a read operation.

Referring to FIG. 3, the memory block 330 may include a plurality of cell strings 340 which are electrically coupled to a plurality of corresponding bit lines BL0 to BLm-1, respectively. The cell string 340 of each column may include at least one drain select transistor DST and at least one source select transistor SST. A plurality of memory cell transistors MC0 to MCn-1 may be electrically coupled in series between the select transistors SST and DST. The respective memory cells MC0 to MCn-1 may be configured by multi-level cells (MLC) each of which stores data information of a plurality of bits. For reference, in FIG. 3, 'DSL' denotes a drain select line (i.e., a string select line), 'SSL' denotes a source select line (i.e., a ground select line), and 'CSL' denotes a common source line.

A read/write circuit 320 of the memory device 300 may be controlled by the control circuit, and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers (PBs) 322, 324 and 326 respectively corresponding to columns (or bit lines) or pairs of columns (or pairs of bit lines), and a plurality of latches (not shown) may be included in each of the page buffers 322, 324 and 326.

The memory device 150 may be realized as a 2-dimensional or 3-dimensional memory device. For example, as shown in FIG. 4, in the case where the memory device 150 is realized as a 3-dimensional nonvolatile memory device, the memory device 150 may include a plurality of memory blocks BLK0 to BLKN-1. For example, the respective memory blocks BLK0 to BLKN-1 may be realized as a 3-dimensional structure by including a structure which extends in first to third directions (for example, the x-axis direction, the y-axis direction and the z-axis direction).

The respective memory blocks BLK0 to BLKN-1 may include a plurality of NAND strings extending in the second direction. The plurality of NAND strings may be provided in the first direction and the third direction. Each NAND string may be electrically coupled to a bit line, at least one string select line, at least one source select line, a plurality of word lines, at least one dummy word line, and a common source line, and include a plurality of transistor structures.

Figure 5:
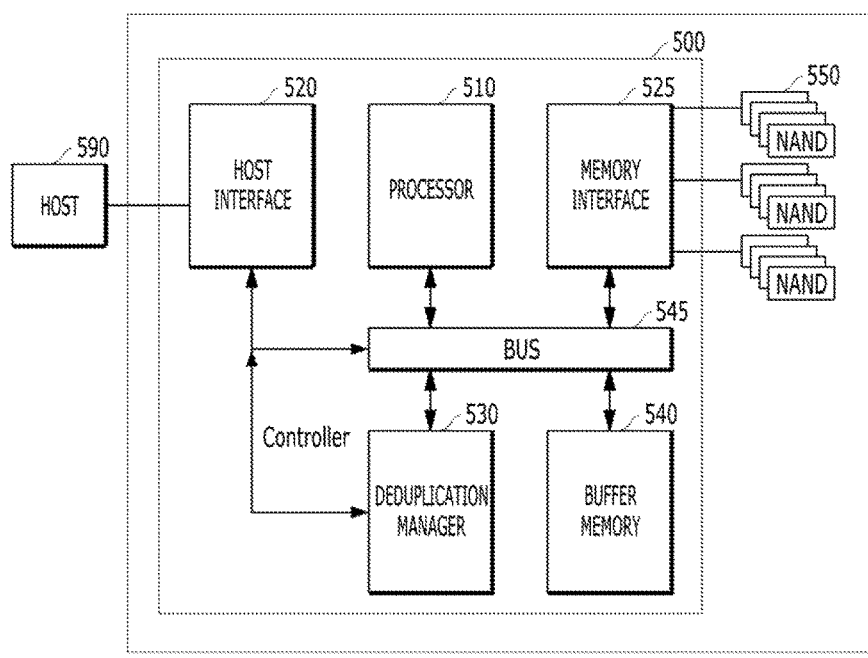
FIG. 5 is a diagram showing an exemplary configuration of a memory system, in accordance with various embodiments of the present invention.

FIG. 5 is a diagram showing an exemplary configuration of a memory system in accordance with various embodiments of the present invention. For example, FIG. 5 may be the configuration of a solid state drive (SSD) as the memory system.

Referring to FIG. 5, the memory system may include a controller 500 and a memory device 550. The controller 500 may include a processor 510, a host interface 520, a memory interface 525, a deduplication manager 530, a buffer memory 540 and a bus 545. The bus 545 may be an on-chip bus.

Figure 7:
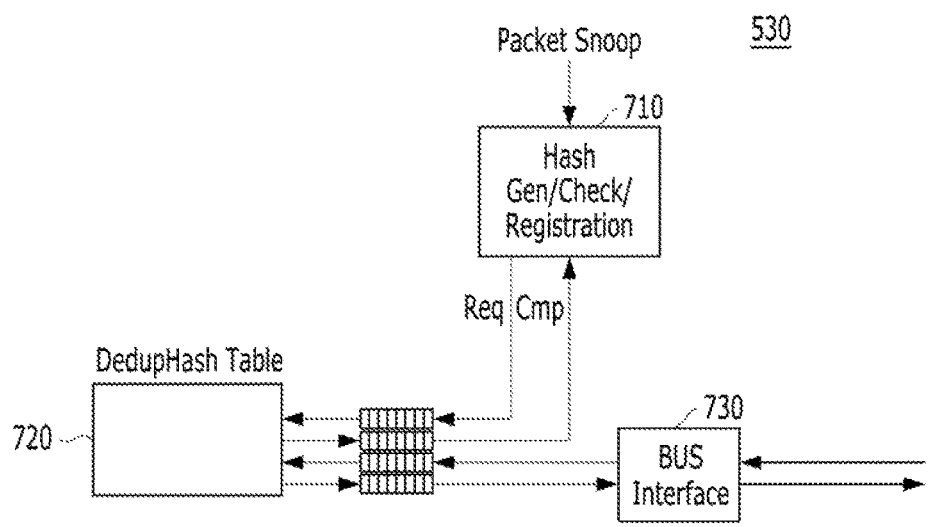
FIG. 7 is a diagram showing an exemplary configuration of a deduplication manager, in accordance with various embodiments of the present invention.

The controller 500 may be the controller 130 of FIG. 1, and the memory device 550 may be the memory device 150 of FIG. 1. Furthermore, the deduplication manager 530 may be configured in an independent form within the controller 500 as shown in FIG. 7. In some embodiments, the deduplication manager 530 may be configured within the processor 510.

The host interface 520 may perform an interface function between the controller 500 and a host 590. The memory interface 525 may perform an interface function between the controller 500 and the memory device 550. The buffer memory 540 may buffer read data and/or write data. The processor 510 may control an overall operation of the memory system. The processor 510 may control operations for storing data in the memory device 550 in response to a write request from the host 590. Also, the processor 510 may control operations for reading data written in the memory device 550 in response to a read request from the host 590 and outputting the read data to the host 590. The deduplication manager 530 may perform an operation for compressing program data (or write data) received from the host 590 (or the controller of an electronic device). Also, the deduplication manager 530 may perform an operation for searching a deduplication table (e.g., table 720) for obtained compressed data and determining whether the retrieved data is duplicated or not. Further, the deduplication manager 530 may perform an operation for registering obtained compressed data with the deduplication table if the obtained compressed data is new. The processor 510, the host interface 520, the memory interface 525, the deduplication manager 530 and the buffer memory 540 within the controller 500 may be coupled to the bus 545. The bus 545 may provide paths for data, commands and/or control signals. In the following description, the compression operation of the deduplication manager 530 may include an operation for obtaining a hash value and/or a lossless compression operation.

In the following description, the term "program data" may refer to data to be written in the memory device 550 by the controller 500.

Figure 6:
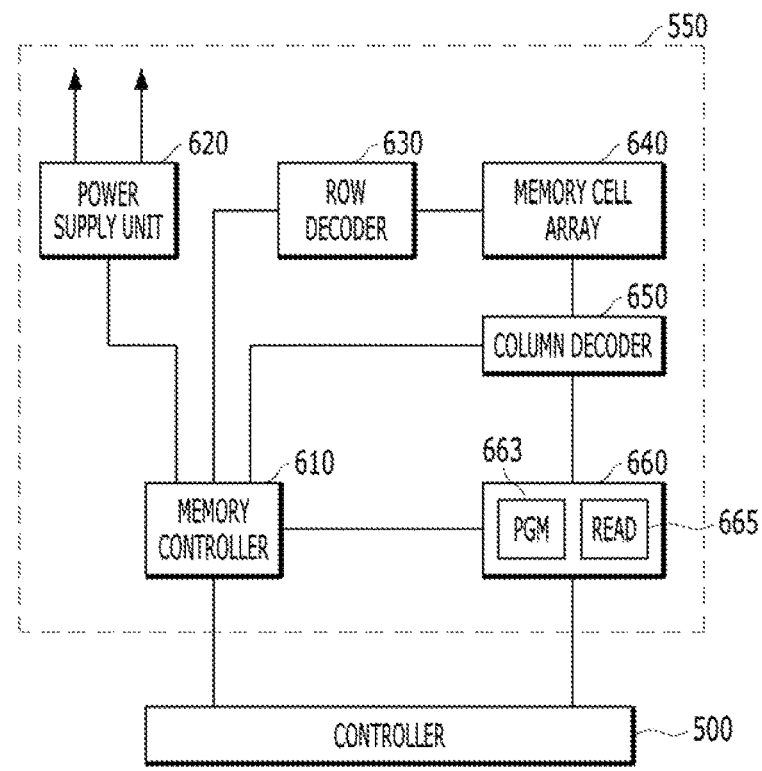
FIG. 6 is a diagram showing an exemplary configuration of a memory device, in accordance with various embodiments of the present invention.

FIG. 6 is a diagram showing an exemplary configuration of a memory device employed in a memory system, in accordance with various embodiments of the present invention. For example, the memory device of FIG. 6 illustrates the memory device 550 of FIG. 5.

Referring to FIG. 6, the memory device 550 may include a memory controller 610, a power supply unit 620, a row decoder 630, a memory cell array 640, a column decoder 650 and a program/read circuit 660.

The memory device 550 may include, for example, a flash memory device, such as a NAND flash or a NOR flash, a ferroelectrics random access memory (FeRAM), a phase-change random access memory (PCRAM), a magnetic random access memory (MRAM) or a resistive random access memory (ReRAM). In the following description, the memory device 550 may be a NAND flash, e.g., a non-volatile memory device.

The memory cell array 640 may be coupled to a plurality of word lines WL and a plurality of bit lines BL. The memory cell array 640 may include a plurality of memory cells disposed in respective areas in which the plurality of word lines WL and the plurality of bit lines BL are intersected. The memory cell array 640 may receive an address ADDR for indicating a memory cell to be accessed along with a command CMD. The address ADDR may include a row address X_ADDR for selecting a word line WL of the memory cell array 640 and a column address Y_ADDR for selecting a bit line of the memory cell array 640.

The row decoder 630 is coupled to the memory cell array 640 through the word lines WL, and may select at least one of the word lines in response to the row address X_ADDR. The column decoder 650 is coupled to the memory cell array 640 through the bit lines BL, and may select at least one of the bit lines in response to the column address Y_ADDR.

The program/read circuit 660 may include a program (PGM) circuit 663 and a read circuit 665. The program circuit 663 is coupled to a selected bit line BL through the column decoder 650, and may perform a program operation (i.e., data write operation) by providing a program pulse to a selected memory cell of the memory cell array 640. The read circuit 665 is coupled to a selected bit line BL through the column decoder 650, and may read (or output) stored data by sensing the level of a selected memory cell of the memory cell array 640. Furthermore, the read circuit 665 may output data to the outside of the memory device 550, for example, the controller 500.

The power supply unit 620 may generate various types of voltages for performing a program, read or erase operation on the memory cell array 640 based on voltage control of the memory controller 610. Furthermore, the power supply unit 620 may generate a driving voltage (or bias voltage) for driving the plurality of word lines WL and bit lines BL, for example, a set program voltage, a reset voltage, a read voltage, and a block voltage.

The memory controller 610 may output voltage control signals for programming data into the memory cell array 640 or reading data from the memory cell array 640 to the power supply unit 620 based on the command CMD, the address ADDR and the control signal CTRL received from the controller 500. Furthermore, the memory controller 610 may provide operating control signals from the controller 500 to the program/read circuit 660, the power supply unit 620, the row decoder 630 and the column decoder 650. The memory controller 610 may generally control operations within the memory device 550.

Figure 8:
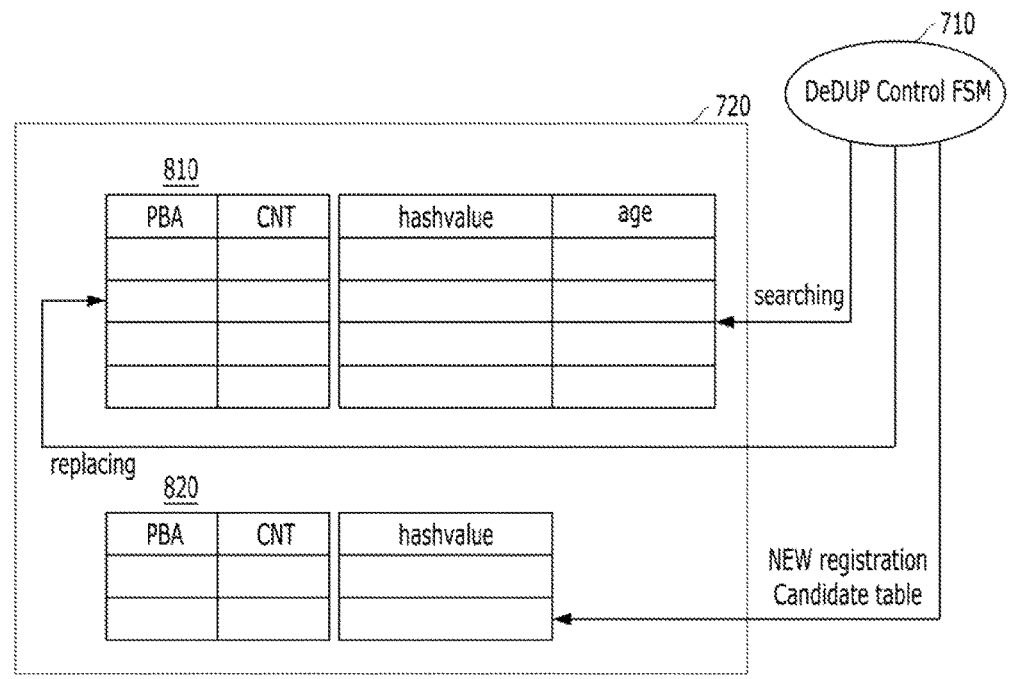
FIG. 8 is a diagram showing an example of a deduplication table, in accordance with various embodiments of the present invention.

FIG. 7 is a diagram showing an exemplary configuration of the deduplication manager 530 in accordance with various embodiments of the present invention. FIG. 8 is a diagram showing an example of a deduplication table 720 in accordance with various embodiments of the present invention.

Referring to FIG. 7, the deduplication manager 530 may include a management controller 710 and the deduplication table 720. In accordance with various embodiments of the present invention, the deduplication manager 530 may be independently configured within the controller 500 as shown in FIG. 5 or may be configured within the processor 510. Furthermore, the deduplication table 720 may be configured within the deduplication manager 530. In accordance with various embodiments of the present invention, the deduplication table 720 may be configured in the buffer memory 540 or may be configured in the memory device 550.

The management controller 710 may include a configuration and/or method for performing data compression, duplication search and registration. The management controller 710 may receive program data through the host interface 520 and compress the received program data. In accordance with one embodiment, the program data received through the host interface 520 may be applied to the processor 510 and the management controller 710. That is, the management controller 710 may perform parallel input (or packet snooping) on the program data applied to the processor 510. The management controller 710 may include a data compressor. The data compressor may use a hash algorithm or a lossless compression algorithm or both the hash algorithm and the lossless compression algorithm. The management controller 710 may determine whether program data is duplicated or not by searching the deduplication table 720, such as that of FIG. 8, for corresponding compressed data. The term "duplication or its derivatives" to be described hereunder may be used as a term meaning that the same data as received program data has been written in the memory device 550 and/or the buffer memory 540. In the following description, the term "compressed data" may be used as a term including a hash value, lossless compressed data or both a hash value and lossless compressed data.

Referring to FIG. 8, the deduplication table 720 may include a registration table 810 and a new registration candidate table 820. The registration table 810 shows an example in which compressed data is a hash value. The registration table 810 may have a structure which may include a plurality of entries corresponding to program data written in the memory device 550, respectively. Furthermore, each of the entries may include compressed data, address information and a counter. In each of the entries, a physical block address (PBA) may be information about an address of the memory device 550 in which data has been written. The counter "CNT" may be the write request number of program data. The compressed data may be the hash value of data stored in the memory device 550. An "age" may be information about the time when a corresponding hash value is stored in the registration table 810. The new registration candidate table 820 is a table which may be used if the registration table 810 does not have an available entry for program data which is to be newly registered. PBAs, counters (CNTs) and hash values may be registered with the entries of the new registration candidate table 820. The number of entries in the deduplication table 720 may be managed and maintained in a proper number. As the number (or size) of entries increases, a write amplification (WA) effect according to deduplication may increase.

After compressing program data, the deduplication manager 530 may determine whether the program data is duplicated or not by searching the deduplication table 720 for corresponding compressed data. For example, if the corresponding compressed data is searched for in the deduplication table 720, the compressed data may have the state in which the same data as the program data has been written in the memory device 550. In such a case, the deduplication manager 530 may send information about a PBA of the memory device 550 at which the program data has been stored to the processor 510, and may update information about a corresponding write request number by increasing the value of a corresponding counter "CNT." Furthermore, as a result of the search, if it is found that corresponding compressed data is present in the deduplication table 720, the deduplication manager 530 may request the write of the program data from the processor 510. Furthermore, the deduplication manager 530 may register the PBA and compressed data, transmitted by the processor 510, with an empty entry of the registration table 810. In this case, if the PBA and compressed data of new program data cannot be registered with the registration table 810, the deduplication manager 530 may register the PBA and compressed data of the new program data with the new registration candidate table 820.

An operation for writing, by the memory system in accordance with various embodiments of the present invention, data is described below. The host 590 may transmit program data and a write command to the controller 500. Information transmitted by the host 590 may include a logical block address (LBA). The program data and write command received from the host 590 may be transferred from the host interface 520 to the processor 510 and the deduplication manager 530.

The deduplication manager 530 may compress program data and search the deduplication table 720 for compressed data. If, as a result of the search, it is found that the compressed data is present in the deduplication table 720, the deduplication manager 530 may increase the counter value of an entry related to the program data and may transmit a PBA related to the compressed data to the processor 510. The PBA transmitted to the processor 510 may be information about an address of the memory device 550 at which the same data as the program data has been stored. When the PBA is received from the deduplication manager 530, the processor 510 maps the PBA to an LBA of the host 590, and may not perform an operation for writing the program data in the memory device 550.

If, as a result of the search, it is found that the compressed data is not present in the deduplication table 720, the deduplication manager 530 may request the write of the program data from the processor 510. The processor 510 may allocate a PBA for storing the program data in the memory device 550 and perform control so that the program data is written in the memory device 550. The processor 510 may allocate the PBA of the memory device 550 for writing the program data, may map the PBA to an LBA, and may transmit the PBA to the deduplication manager 530. The deduplication manager 530 may newly register the compressed data and the PBA with the deduplication table 720 and set the value of a corresponding counter to 1.

The read and written data of the memory device 550 may be processed in a set unit (e.g., a page). For example, in the memory system, program data may be addressed in a unit of 512 bytes or 4 Kbytes (i.e., a minimum unit). The host 590 may transmit information, including program data with the minimum unit and an LBA, to the controller 500. The controller 500 may allocate a PBA of the memory device 550 in which data with the minimum unit is stored, and may write program data with the minimum unit corresponding to the assigned PBA. Furthermore, the controller 500 may map the PBA to the LBA so that the written data can be read in response to a read command from the host 590. In the following description, the LBA may be a first address, and the PBA may be a second address.

When an erase command is generated by the host 590, the controller 500 may erase corresponding data in a block. In this case, the controller 500 may erase the corresponding data in the block from the memory device 500. The deduplication manager 530 may erase information about an entry related to a PBA of the erased block.

Various embodiments of the present invention propose a method for configuring, by the controller 500, the deduplication table, a method using an initialization pattern, a method for registering a new pattern, and a method for processing the deduplication table upon erase and/or garbage collection (GC) processing. Furthermore, various embodiments of the present invention define a command (e.g., a write-duplication command on an NVMe command) which will be used when the controller 500 checks whether program data is duplicated or not. Furthermore, various embodiments of the present invention propose a method for computing compressed data (or finger print) using a lossless compression algorithm (e.g., run-length coding or Huffman coding) in addition to a hash algorithm (e.g., MD5 128-bit hash or SHA-1 160-bit hash).

Figure 9:
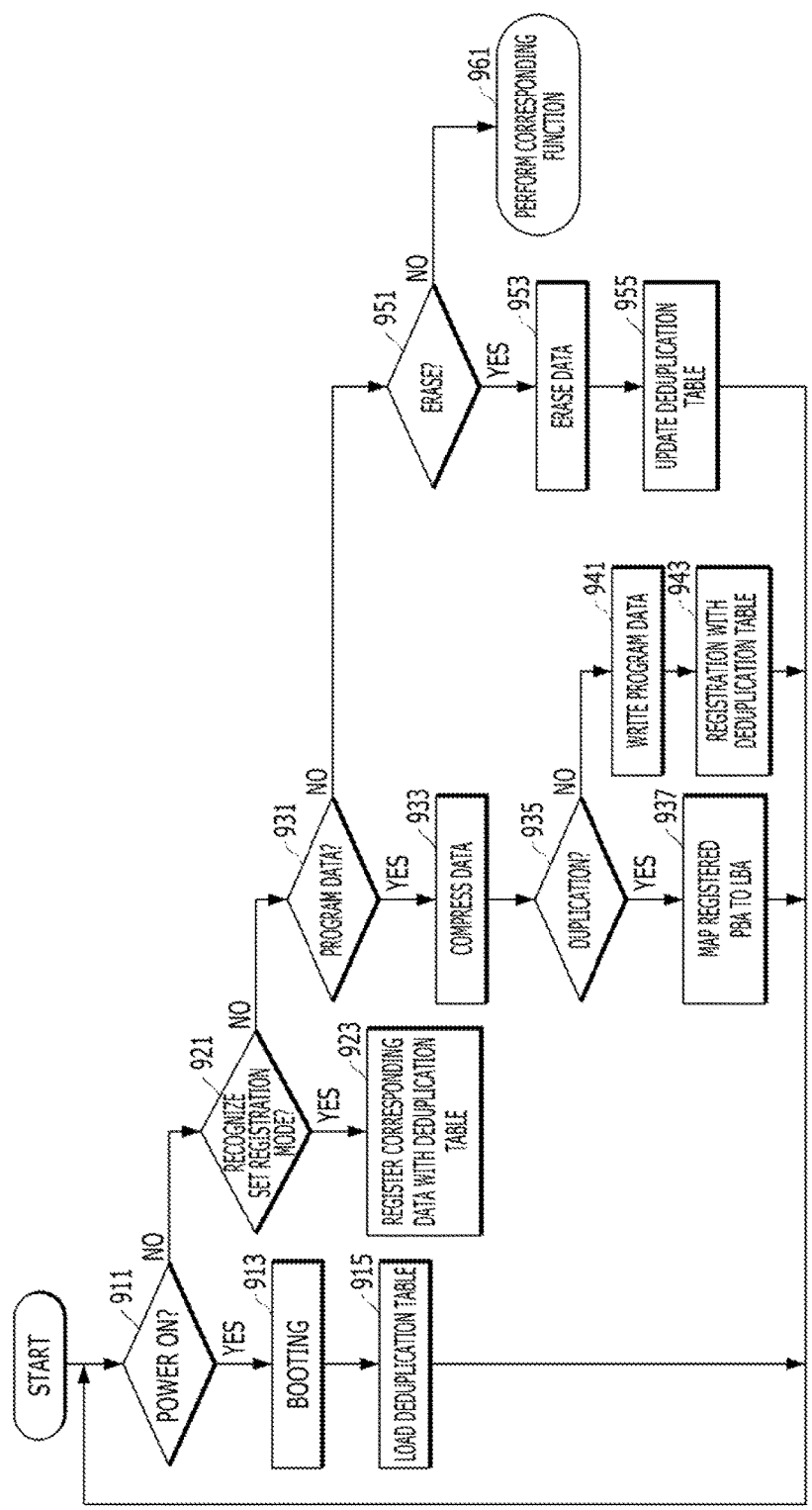
FIG. 9 is a flowchart illustrating an operating procedure of the memory system, in accordance with various embodiments of the present invention.

FIG. 9 is a flowchart illustrating an operating procedure of the memory system, in accordance with various embodiments of the present invention.

Referring to FIG. 9, when the memory system recognizes a power-on state at step 911 (YES), the memory system may then perform a booting operation at step 913, and may load a deduplication table at step 915. The memory system may perform a task for initializing a previous deduplication table (e.g., a deduplication table 720 of FIG. 7) whose power becomes on. When the memory system is booted up, it may load a deduplication table at a set location of the memory device 550 of FIGS. 5 to 6 and load the loaded deduplication table onto the deduplication table 720 of the deduplication manager 530. In this case, in a factory initialization state or if actual write has never been once performed, all of the fields of the loaded deduplication table may be at a zero "0" state.

When the registration mode of a deduplication function is set (at step 911, NO), the memory system may recognize the set registration mode at step 921, and may register corresponding compressed data and a PBA of the memory device 550 in which corresponding program data has been written with the deduplication table 720 at step 923. A user may previously register a frequently used pattern (or known pattern) with the deduplication tablet. The frequently used pattern may be an all zero "0" pattern, an all one "1" pattern or a sequential pattern. A sequential pattern may be a decremental sequential pattern an incremental sequential pattern or a combination thereof. A user may register patterns that are frequently used in the registration mode with the deduplication table 720.

When the program data is received, the memory system may recognize the received program data at step 931 (YES), may compress the program data at step 933, and may determine whether the program data is duplicated or not by searching the deduplication table 720 for corresponding compressed data at step 935. If, as a result of the search, it is found that the corresponding compressed data is present in the deduplication table 720, (step 935 YES), the memory system and may map the PBA of the program data to a corresponding LBA without performing a data write operation at step 937. If, as a result of the search, it is found that the corresponding compressed data is not present in the deduplication table 720, (step 935 NO), the memory system may write the program data in the memory device 550 at step 941, and may map the PBA of the written data to a corresponding LBA. The memory system may register the compressed data and the PBA of the newly written data with the deduplication table 720 at step 943.

When a data erase command is generated, the memory system may recognize the generated data erase command at step 951 (YES), may erase corresponding data from the memory device 550 at step 953, and may update the deduplication table 720 at step 955 by removing pieces of information related to the erased data from the deduplication table 720. When another function is set, the memory system may recognize the set function and perform the corresponding function at step 961. For example, when a read command is generated by the host, the memory system may recognize the generated read command and read data by controlling the memory device 550 through a read operation at step 961.

FIGS. 10A to 10C are diagrams showing exemplary commands for registering, by the memory system, frequently used patterns with the deduplication table 720 in accordance with various embodiments of the present invention.

The memory system may register frequently used patterns with the deduplication table 720 in advance. The frequently used pattern may be user data. For example, an all zero pattern, an all one pattern, an incremental pattern and a decremental pattern have a good possibility that they may be present and may be frequently written in the memory device 550. In addition, artificial patterns which may be generated by an operating system (OS) or an application may also be checked in advance. The memory system in accordance with various embodiments of the present invention may define user data patterns (e.g., an all zero pattern, an all one pattern and a sequential pattern) which may be frequently used and/or patterns (e.g., a specific data pattern of an OS and a bench marking tool) which may be generated by an OS or an application, may compress the defined patterns, and may register the compressed patterns with the deduplication table 720. Compressed data registered with the deduplication table 720 may be data converted into a hash value or a lossless compressed data.

Patterns registered with the deduplication table 720 may be set by the host 590. The host 590 may provide the controller 500 with an interface that enables the controller 500 to be aware that a pattern is duplicated and used (i.e., explicitly). For example, write information indicating whether a corresponding command is duplicated or not may be configured in a write command. A write command on NVMe/SATA/eMMC/UFS may have a reserved field. The host 590 may indicate (or additionally describe) whether a pattern is duplicated or not using the reserved field of the write command. When write data is received through the host interface 520 from the host 590, the controller 500 may forcedly register the write data with the deduplication table 720. The controller 500 may previously register patterns that may be frequently duplicated in a write operation with the deduplication table 720 in response to a hint from the host 590. Transferring, by the host 500 such a duplication hint to the controller 500 may be performed, for example, by the following two methods. A first method may include adding an independent command. A second method may include defining the reserved field of a write command as a duplication hint feature.

FIG. 10A is a diagram showing an example in which a write command including a duplication hint feature is additionally defined by an NVMe command set. FIG. 10B is a diagram showing an example in which write duplication (Write-DUPLICATION) has been defined as a command of a vendor-specific type. As shown in FIG. 10B, a write duplication hint feature may be defined as a command of a vendor-specific type, and may be added as a value between 16 h~7 Fh. FIG. 10C is a diagram showing an example in which an existing write command is used without any change and the reserved field bit (i.e., a bit of a reserved field [31:8]) of a Dataset Management (DSM) (Command Dword-13) is used. For example, Write-DUPLICATION may have a form hinting that data described by a current command has a duplication possibility if [8] bit of the Dword-13 of the command is set.

The memory system may register data patterns (e.g., an all zero pattern, an all one pattern and a sequential pattern), having a stochastically good possibility, with the deduplication table 720 using methods, such as those of FIGS. 10A to 10C. Furthermore, the memory system may also register patterns, generated by an OS or an application (e.g., patterns of bench mark tools), with the deduplication table 720 using methods, such as those of FIGS. 10A to 10C. The data pattern registered with the deduplication table 720 may be registered in a compressed form. For example, the compression of the data pattern may be performed using the hash algorithm. Alternatively, the compression of the data pattern may be performed using the lossless compression algorithm. The data pattern may be stored in the memory device 550. The data pattern may be stored in the memory device 550 and may be moved and stored in the buffer memory 540 when the memory system is initialized. If the buffer memory 540 is non-volatile memory, the data pattern may be stored in the buffer memory 540. The deduplication table 720 may include the compressed data with the data pattern and information about an address (e.g., the memory device 550 or the buffer memory 540) at which the data pattern has been stored.

When writing program data, the memory system may search the deduplication table 720. If, as a result of the search, it is found that the program data is duplicated program data, the memory system may map only addresses without writing the program data in the memory device 550. If the program data is new program data, the memory system may register the new program data with the deduplication table 720.

Figure 11:
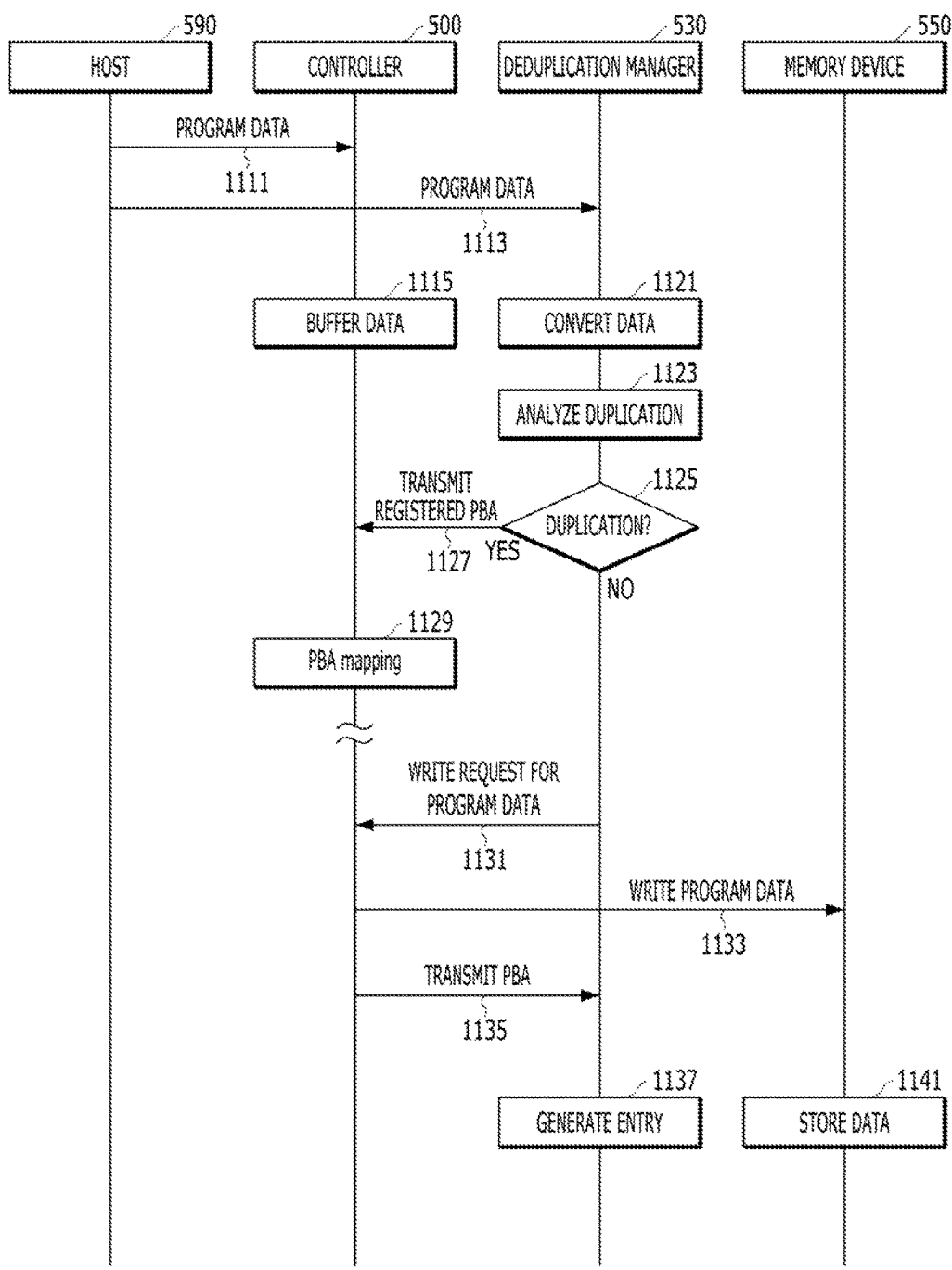
FIG. 11 is a flowchart illustrating an exemplary operation for writing program data in the memory system, in accordance with various embodiments of the present invention.

FIG. 11 is a flowchart illustrating an exemplary operation for writing program data in the memory system in accordance with various embodiments of the present invention.

Referring to FIG. 11, program data received through the host interface 520 may be transferred to the processor 510 of the controller 500 at step 1111 and may be transferred to the deduplication manager 530 at step 1113. In the following description, the operation of the processor 510 may be described as being the operation of the controller 500. The deduplication manager 530 may receive the program data simultaneously with the controller 500. The controller 500 may buffer the received program data in the buffer memory 540 at step 1115.

The deduplication manager 530 may convert the received program data into compressed data (or a finger print value) by processing the received program data using a predetermined algorithm at step 1121. The predetermined algorithm may be a hash algorithm and/or a compression algorithm. The deduplication manager 530 may determine whether the program data is duplicated or not by analyzing the deduplication table at step 1123. If, as a result of the analysis, it is found that the compressed data is present in the deduplication table 720, the deduplication manager 530 may determine that the same program data has been written in the memory device 550, that is, that the same program data has been duplicated. If it is determined that the same program data has been duplicated, the deduplication manager 530 may recognize such duplication at step 1125 (YES) and transmit information about a corresponding registered PBA (registered PBA with the deduplication table 720) to the controller 500 at step 1127. The registered PBA which is transmitted to the controller 500 is a PBA of the memory device 550 in which the same data as the received program data has been written. The controller 500 may map the received PBA to the LBA of the received program data at step 1129. Importantly, when the registered PBA is received from the deduplication manager 530, the controller 500 may map the received PBA to the LBA of the received program data without performing an operation for writing the program data in the memory device 550.

If it is determined that the same program data has not been duplicated at step 1125 (NO), the deduplication manager 530 may request the controller 500 to write the program data at step 1131. A method for requesting to write the program data may include a signal providing notification that the received program data is non-duplicated data. When the request to write the program data is received, the controller 500 may then, at step 1133, assign a PBA of the memory device 550 at which the program data will be stored, and may transmit pieces of information for writing the program data through the memory interface 525 to the memory device 550. In this case, the pieces of information for writing the program data may include the program data, the PBA information, a write command and a control signal for performing a write operation. The memory device 550 may write, i.e., store the program data in the assigned PBA location at step 1141. The controller 550 may also transmit the PBA of the program data to the deduplication manager 530 at step 1135. The deduplication manager 530 may set an empty entry or a replaceable entry in the deduplication table 720 at step 1137, and may newly register the compressed data (i.e., finger print value) of the program data and the PBA with the set entry.

The memory system may include a deduplication table 720 including compressed data and information about a PBA of the memory device in which data has been written, may calculate the finger print value of received program data, may determine whether the received program data is duplicated or not by searching the deduplication table 720 for the finger print value. In the memory system, a compression method may be used as a method for calculating the finger print value.

The size of the program data may be a unit of data for writing the program data in the memory device 550. The unit of data may be, for example, 512 bytes or 4 Kbytes. The deduplication manager 530 may calculate the finger print value by converting the program data. A method for calculating the finger print value may be performed using a hash algorithm. The size (n-bit) of a hash value may be set as a proper size, if necessary. For example, assuming that the size of data is 512 bytes and the size of the hash value is 16 bytes, the hash value with 16 bytes may be calculated with respect to the received data with 512 bytes using the hash algorithm. Furthermore, a method for calculating the finger print value may be performed using a lossless compression algorithm instead of the hash algorithm. For example, the lossless compression algorithm may generate the program data with 512 bytes into lossless compressed data with N bytes. The memory system can restore data into data that is precisely identical with data prior to the lossless compression by restoring lossless compressed data. Accordingly, when writing program data, the memory system can check whether the program data is duplicated or not without reading data which are written in the memory device 550. A case where lossless compressed data has a high compression ratio may mean a case where program data is duplicated a lot.

In an embodiment, the memory system may use data, converted into a hash value based on a hash algorithm with respect to received program data, as a finger print value. In another embodiment, the memory system may use data that has been lossless-compressed with respect to received program data as a finger print value. In still another embodiment, the memory system may convert program data into lossless compressed data and a hash value and may use the two compressed data as finger print values.

First, a method for calculating a finger print value using a hash algorithm is described below.

Figure 12:
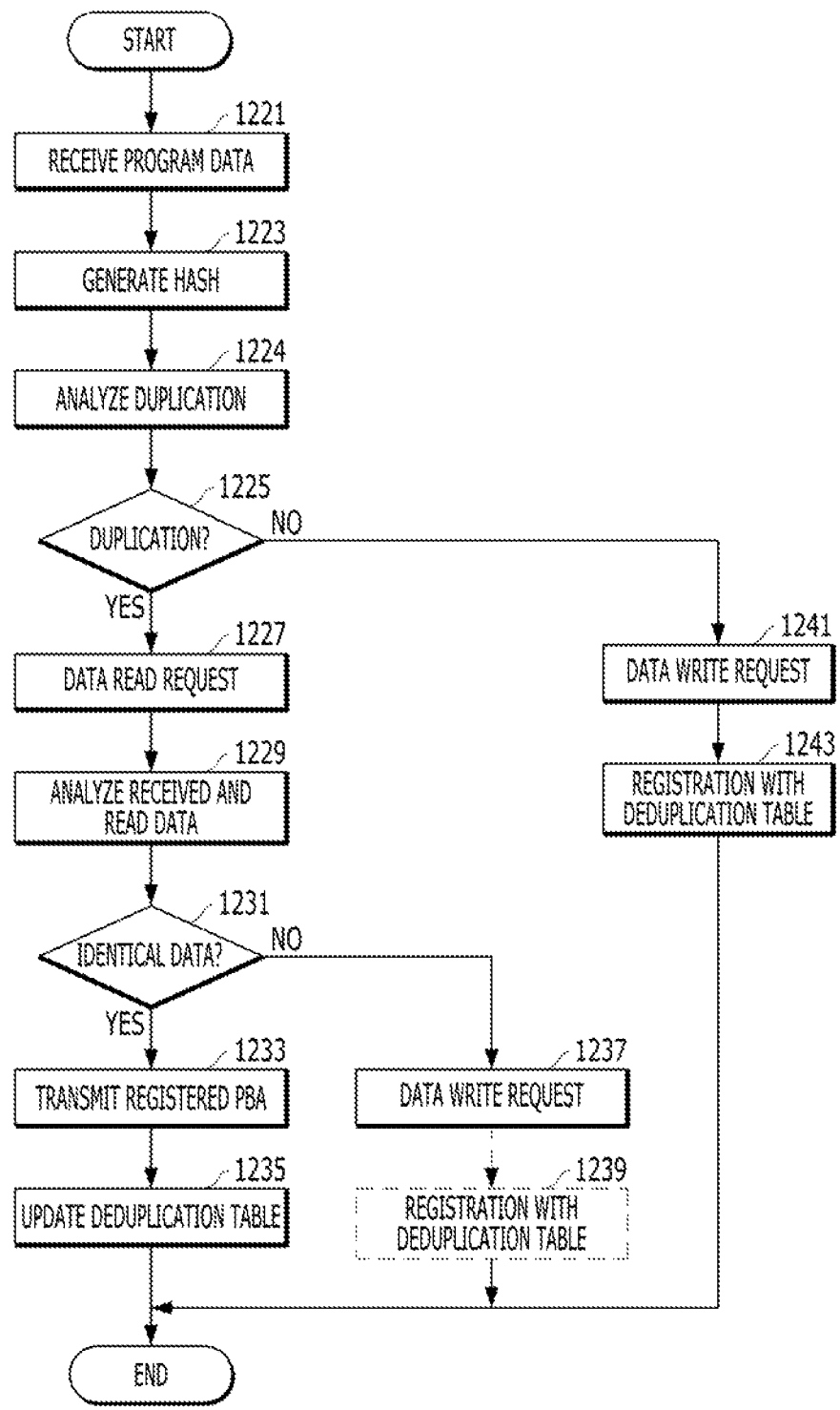
FIG. 12 is a flowchart illustrating an exemplary operation for writing program data based on a hash algorithm in the memory system, in accordance with various embodiments of the present invention.

FIG. 12 is a flowchart illustrating an exemplary operation for writing program data based on a hash algorithm in the memory system in accordance with various embodiments of the present invention.

Referring to FIG. 12, the hash algorithm may be an algorithm for mapping data of a specific length to data of a fixed length. A value obtained by the hash algorithm may be called a hash value, hash code, a checksum or a hash. A hash value obtained by a hash function may have a hash collision indicative of the same output value with respect to different input values. If a hash value (e.g., compressed data and/or a finger print value) is obtained by the hash algorithm, the memory system may perform a write operation on program data by taking into consideration a hash collision.

When program data is received at step 1221, the deduplication manager 530 may generate a hash value based on the hash algorithm at step 1223. The deduplication manager 530 may determine whether the hash value is duplicated or not by searching the deduplication table 720 at step 1224. If, as a result of the search, it is found that the obtained hash value is present in the deduplication table 720, the deduplication manager 530 may recognize the retrieved hash value at step 1225 (YES), and may transmit a PBA registered with the entry of the recognized hash value to the controller 500 at step 1227. The controller 500 may transmit a read command, including the received PBA, to the memory device 550, and may transfer data read from the memory device 550 to the deduplication manager 530. The deduplication manager 530 may determine whether the received program data and the read data are the same data by performing a comparison and analysis on the received program data and the read data at step 1229. If the two data are the same data, the deduplication manager 530 may recognize that the two data are the same data at step 1231 (YES), may select a PBA registered with a corresponding entry of the deduplication table 720 (i.e., a PBA related to the hash value of the same data) at step 1233, and may transmit the selected PBA to the controller 500. Furthermore, the deduplication manager 530 may update the write number of the program data by increasing the value of a counter in the entry of the deduplication table 720 at step 1235. When the PBA is received, the controller 500 may map the received PBA to the LBA of the received program data and may not perform a write operation on the program data.

If the program data and the read data are not the same data, a hash collision may have been generated. If the two data is not the same data, the deduplication manager 530 may recognize that the two data is not the same data at step 1231 (NO), the deduplication manager 530 may request the write of the program data from the controller 500 at step 1237. When the write request is received, the controller 500 may assign the PBA of the received program data and may control an operation for writing the program data into the assigned PBA of the memory device 550. If a hash collision is detected by searching the deduplication table 720, the deduplication manager 530 may perform a method for updating the deduplication table 720 or a method for maintaining the current deduplication table 720 without any change. If the method for updating the deduplication table 720 is to be performed, the deduplication manager 530 may request information about the PBA of the memory device 550 in which the program data has been written from the controller 500 at step 1239, and may additionally register the PBA with the entry of a hash value in which the hash collision has occurred in parallel. If the method for not updating the deduplication table 720 is to be performed, the deduplication manager 530 may omit the operation of step 1239 and terminate the process.

If the hash value of the program data is not searched for in the deduplication table 720, the deduplication manager 530 may recognize that the hash value of the program data is not present at step 1225 (NO), and may request the write of the program data from the controller 500 at step 1241. The deduplication manager 530 may newly register the PBA information transferred by the controller 500 and the hash value with a set entry of the deduplication table 720 at step 1243. When performing a new registration operation, the deduplication manager 530 may search the deduplication table 720 for an empty entry. If, as a result of the search, it is found that an empty entry is present in the deduplication table 720, the deduplication manager 530 may newly register the PBA and the hash value with a corresponding entry. If, as a result of the search, it is found that an empty entry is not present in the deduplication table 720, the deduplication manager 530 may select a replacement entry that belongs to the entries of the deduplication table 720 and that has low priority, and may newly register the PBA and the hash value with the replacement entry.

Figure 13:
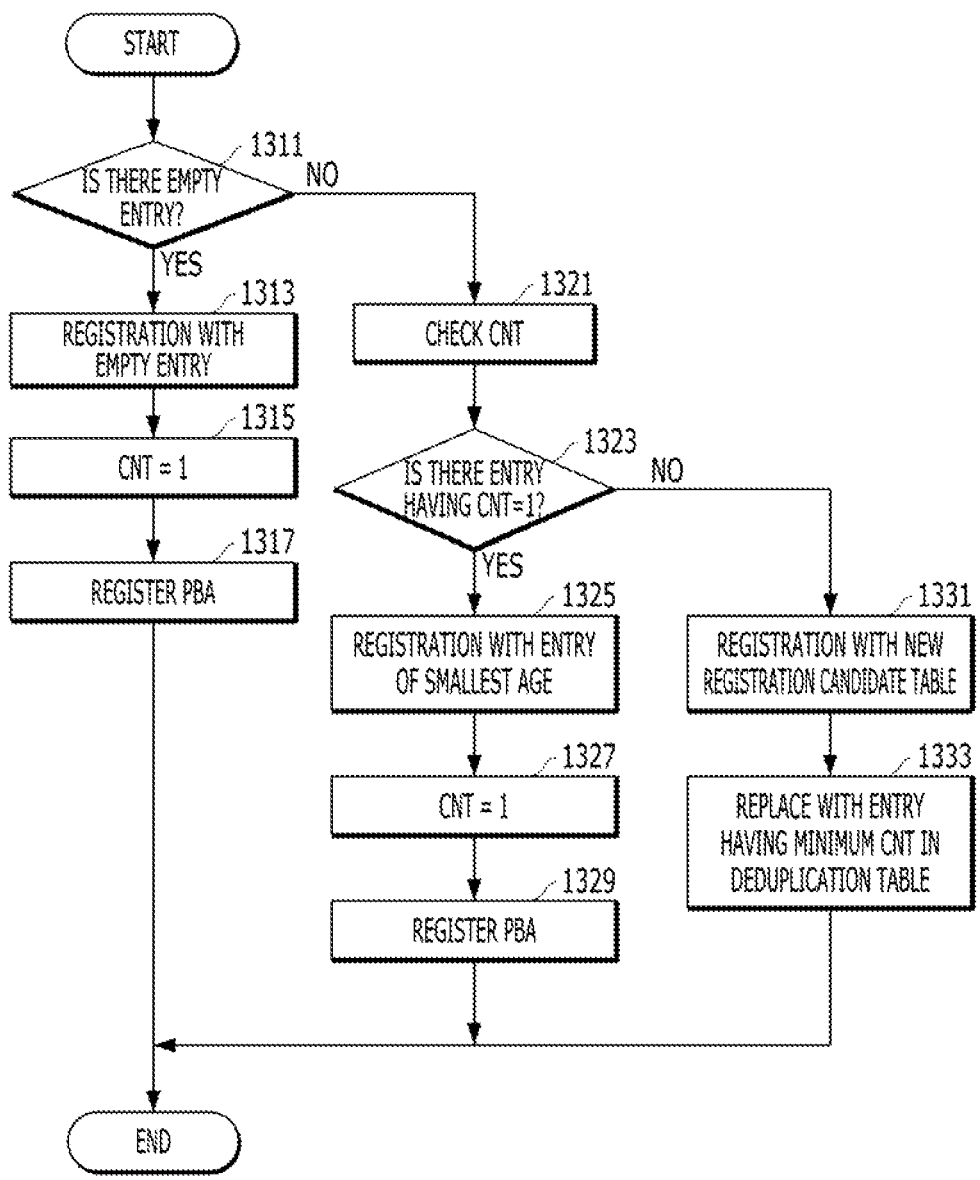
FIG. 13 is a flowchart illustrating an exemplary operation for new registration with the deduplication table in the memory system, in accordance with various embodiments of the present invention.

FIG. 13 is a flowchart illustrating an operation for a new registration with the deduplication table 720 in the memory system, in accordance with various embodiments of the present invention.

Referring to FIG. 13, if a hash value is not present in the deduplication table 720, the deduplication manager 530 may search the deduplication table 720 for an empty entry at step 1311. If, as a result of the search, it is found that an empty entry is present in the deduplication table 720 (step 1311, YES), the deduplication manager 530 may register a hash value with the retrieved empty entry at step 1313. Then, the deduplication manager 530 may set the value of a corresponding counter to 1 at step 1315, and may register a PBA of the memory device 550 in which program data has been written with the retrieved empty entry at step 1317.

If, as a result of the search, it is found that an empty entry is not present in the deduplication table 720, the deduplication manager 530 may recognize that an empty entry is not present at step 1311 (NO) and may check the counter values of entries that form the deduplication table 720 at step 1321. If the counter value of an entry is small, it may mean that corresponding program data also has a small write number. If, as a result of the check, it is found that an entry having a counter value with 1 is present in the process of checking the counter values, the deduplication manager 530 may recognize the entries having the counter value with 1 at step 1323 (YES), and may register the hash value with an entry that belongs to the entries having the counter value with 1 and has the smallest age value at step 1325. Then, the deduplication manager 530 may set the counter value of the entry having the smallest age value to 1 at step 1327, and may register the PBA with the entry having the smallest age value at step 1329.

If an entry having a counter value with 1 is not present in the deduplication table 720 (step 1323, NO), the deduplication manager 530 may register the hash value, the PBA and the counter value (CNT=1) with the new registration candidate table of the deduplication table at step 1331. Then, the deduplication manager 530 may replace an entry having a minimum counter value in the deduplication table 720 with pieces of information registered with the new registration candidate table 820 at step 1333.

As shown in FIG. 13, if the hash value of the program data is not present in the deduplication table 720, the deduplication manager 530 may perform a new registration operation. In the case of a new addition, the deduplication manager 530 may first compare a hash (or finger print) value with existing registered entries and check whether an entry having the same hash value is present. First, if, as a result of the check, it is found that an entry having the same hash value is not present in the deduplication table 720 and an empty entry is present in the deduplication table 720, the deduplication manager 530 may register the hash value with the empty entry and request the write of the program data from the controller 500. Furthermore, the deduplication manager 530 may register a PBA, transferred by the controller 500, with the empty entry and may set CNT=1. Second, if, as a result of the check, it is found that an entry having the same hash value is not present in the deduplication table 720 and an empty entry is also not present in the deduplication table 720, the deduplication manager 530 may search the deduplication table 720 for an entry having a counter value with 1. If, as a result of the search, it is found that an entry having the counter value with 1 is present, the deduplication manager 530 may select an entry that belongs to entries having the counter value with 1 and has the smallest age value, and may replace an existing entry with the selected entry. Third, if, as a result of the search, it is found that an entry having the counter value with 1 is not present in the deduplication table 720 (e.g., if only entries having a counter value with 2 or more are present) and an empty entry is not present in the deduplication table 720, the deduplication manager 530 may register the hash value with the new registration candidate table and may replace an existing entry with an entry that belongs to the current entries of the deduplication table 720 and that has a minimum counter value. The data packet (i.e., deduplicated packet) of the replaced entry of the deduplication table 720 may be copied, and the replaced entry may be separated as a separate PBA.

Figure 14:
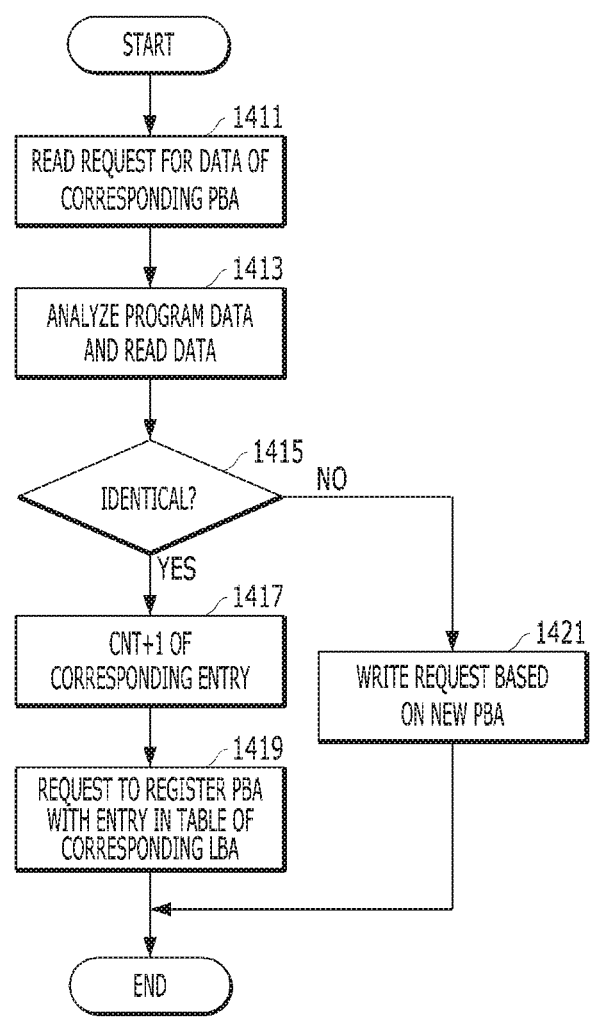
FIG. 14 is a flowchart illustrating an exemplary operation for updating the deduplication table when a hash value is duplicated in the memory system, in accordance with various embodiments of the present invention.

FIG. 14 is a flowchart illustrating an exemplary operation for updating the deduplication table 720 when a hash value is duplicated in the memory system, in accordance with various embodiments of the present invention.

Referring to FIG. 14, the deduplication manager 530 may request the read of the data of a PBA, registered with an entry having the same hash value, from the controller 500 at step 1411. When the read data is received from the controller 500, the deduplication manager 530 may perform a comparison and analysis on the read data and program data at step 1413. In this case, if the two data is the same, the deduplication manager 530 may recognize that the two data is the same data at step 1415 (YES), may update information about the corresponding entry (e.g., increase a corresponding counter value) at step 1417. Then, the deduplication manager 530 may transmit the PBA of the corresponding entry to the controller 500 at step 1419. The controller 500 may map the received PBA to a corresponding LBA of the program data and may not perform an operation for writing the program data.

If the read data and the program data are not the same data, then the deduplication manager 530 may recognize that the two data is not the same data at step 1415 (NO) and may request the write of the program data from the controller 500 at step 1421.

When the hash values are the same, but the read data and the program data are different, a hash collision may have occurred. When a hash collision is generated, the deduplication manager 530 may request the write of the program data from the controller 500 and may not perform an operation for updating the deduplication table 720. However, when a hash collision is generated, the deduplication manager 530 may update an entry of the deduplication table 720 based on information about a PBA written in the memory device 550.

Figure 15:
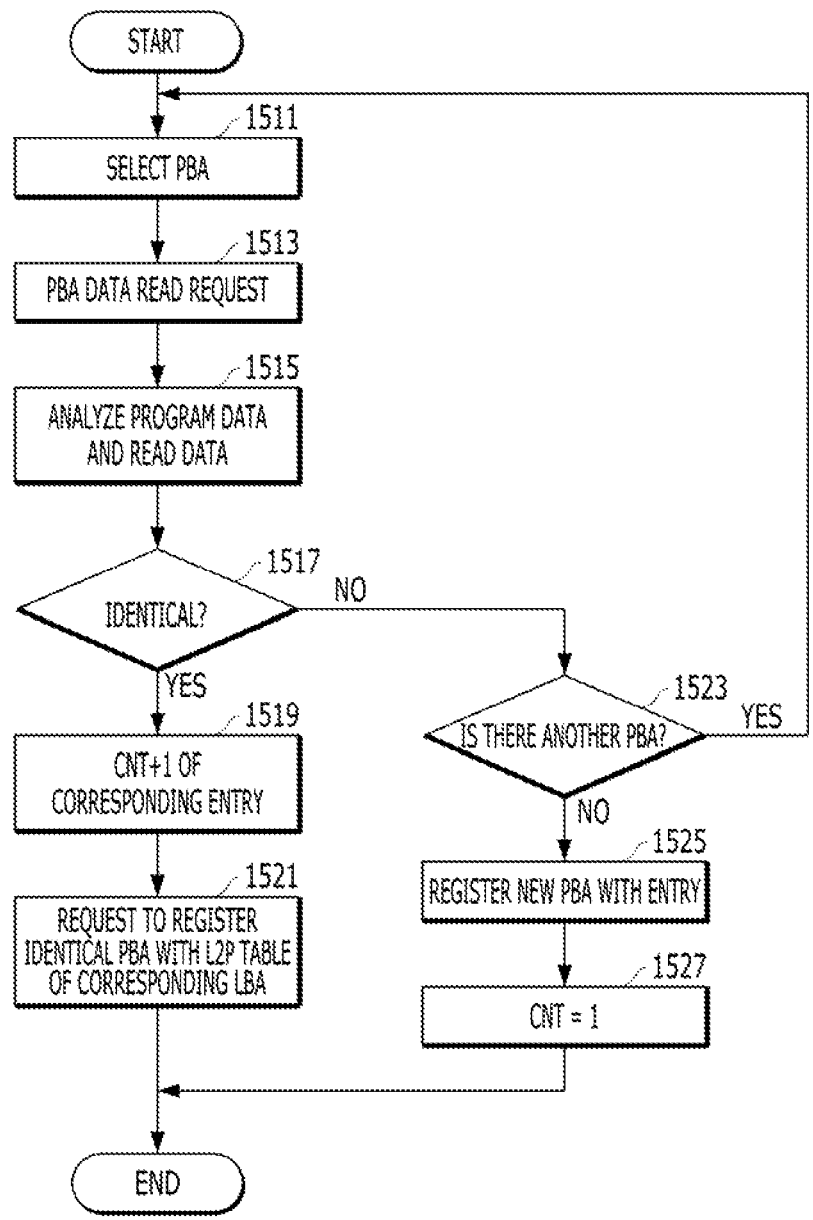
FIG. 15 is a flowchart illustrating another exemplary operation for updating the deduplication table when a hash value is duplicated in the memory system, in accordance with various embodiments of the present invention.

FIG. 15 is a flowchart illustrating another exemplary operation for updating the deduplication table 720 when a hash value is duplicated in the memory system, in accordance with various embodiments of the present invention.

Referring to FIG. 15, the deduplication table 720 may include a plurality of entries having the same hash value, but having different PBAs. If the same hash value as the hash value of program data is present in the deduplication table 720, the deduplication manager 530 may select a PBA for performing a comparison and analysis on the program data and data written in the memory device 550 at step 1511. For example, at step 1511, the deduplication manager 530 may select the PBA of an entry that belongs to entries having the same hash value and that has the greatest counter value (e.g., a PBA having the greatest write requests). The deduplication manager 530 may request the data read of the selected PBA from the controller 500 at step 1513. If the read data and the program data are the same, the deduplication manager 530 may perform a write operation using the same method as that of steps 1411 to 1419 of FIG. 14 at steps 1515 to 1521.

If the read data and the program data are not the same, the deduplication manager 530 may check whether a different PBA is present by searching the deduplication table 720 for different entries having the same hash value at step 1523. If, as a result of the check, it is found that a different PBA is present (step 1523, YES), the deduplication manager 530 may return to step 1511 in which the deduplication manager 530 may repeatedly perform the above operation. In this case, if a plurality of PBAs is present, the deduplication manager 530 may select a PBA by checking the counter values of corresponding entries.

If, as a result of the check at step 1523, it is found that a different PBA is not present (e.g., if only one PBA having the same hash value has been registered or if a plurality of PBAs having the same hash value is present and the program data and the read data are different as a result of search up to the last PBA), the deduplication manager 530 may request the write of the program data from the controller 500 and receive the PBA from the controller 500. The deduplication manager 530 may select an entry having the same hash value, may register the hash value and the new PBA with the selected entry, and may set a corresponding counter value to 1 at steps 1525 and 1527. A method for registering the new PBA may be performed using the same method as that of FIG. 13.

Figure 16:
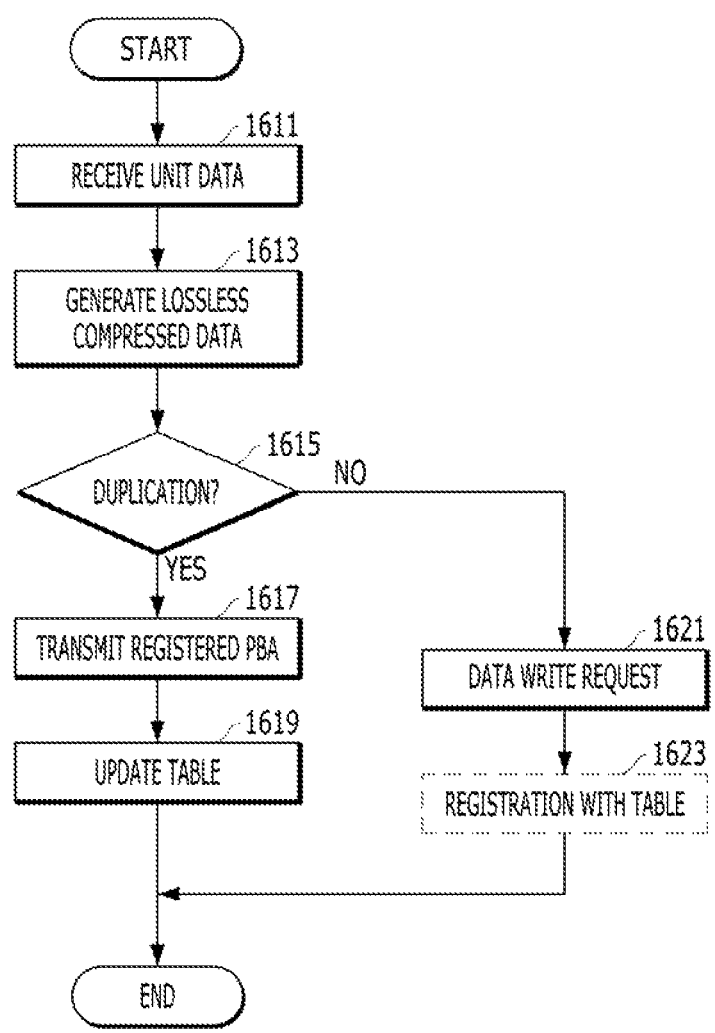
FIG. 16 is a flowchart illustrating an exemplary operation for checking whether lossless compressed data generated based on a lossless compression algorithm is duplicated and updating the deduplication table in the memory system, in accordance with various embodiments of the present invention.

FIG. 16 is a flowchart illustrating an exemplary operation for checking whether lossless compressed data generated based on a lossless compression algorithm is duplicated and updating the deduplication table 720 in the memory system in accordance with various embodiments of the present invention.

Referring to FIG. 16, if a comparison is to be performed on lossless compressed data generated by the lossless compression algorithm, a collision may not be generated between the lossless compressed data because the lossless compressed data includes substantial data values (or contents). That is, the memory system may determine whether program data is duplicated or not by performing only a comparison on lossless compressed data (or finger print values). When program data is received at step 1611, the deduplication manager 530 may compress the program data based on a set lossless compression algorithm and generate lossless compressed data at step 1613. The deduplication manager 530 may determine whether data duplicated with lossless compressed data is present by searching the deduplication table 720 at step 1615. If, as a result of the determination, it is determined that the data duplicated with the lossless compressed data is present (step 1615, YES), the deduplication manager 530 may transmit a PBA, registered with a corresponding entry, to the controller 500 at step 1617, and may update the corresponding entry (i.e., increase a corresponding counter value) at step 1619. If, as a result of the determination, it is determined that the data duplicated with the lossless compressed data is not present in the deduplication table 720, the deduplication manager 530 may recognize that the data duplicated with the lossless compressed data is not present at step 1615 (NO), and may request the write of the program data from the controller 500 at step 1621. Furthermore, the deduplication manager 530 may newly register the lossless compressed data and the PBA with the deduplication table 720 at step 1623.

In an embodiment, the memory system may register data patterns in advance using methods, such as those of FIGS. 10A to 10C. For example, the memory system may compress data patterns that are frequently programmed and/or data patterns that are fixedly generated by an OS and/or an application based on a predetermined lossless compression algorithm, and may register information about an address at which lossless compressed data and a data pattern have been stored with the deduplication table 720 in advance. Furthermore, when controlling the program of data by analyzing lossless compressed data, the memory system may not perform a procedure for newly registering lossless compressed data that has not been searched for in the deduplication table 720. In such a case, the operation of step 1623 in FIG. 16 may be omitted.

If the same finger print value is present in the deduplication table 720 as described above, a method for processing a finger print value obtained based on a lossless compression algorithm and a method for processing a finger print value obtained based on a hash algorithm may be different. If a finger print value is to be calculated based on a lossless compression algorithm, whether program data is duplicated or not may be determined by only comparing the program data with a finger print value registered with the deduplication table 720. In contrast, if a finger print value is to be calculated based on a hash algorithm, finger print values are the same, but may have different actual data. Accordingly, if a finger print value is to be calculated based on a hash algorithm, whether program data is duplicated or not may be determined by taking a hash collision into consideration.

In an embodiment, in a case where an entry that belongs to entries and has the same finger print value is present and data registered with the entry is a finger print value calculated based on a lossless compression algorithm, if the finger print values are the same, the memory system may increase the counter value of a corresponding entry of the deduplication table 720 and map the PBA of the same entry to the L2P table of a corresponding LBA.

In an embodiment, if entries having the same finger print value are present in the deduplication table 720 and data registered with the entries are finger print values calculated based on a hash algorithm, the memory system may determine whether or not read data and program data are the same by reading the data of PBAs registered with the corresponding entries. In this case, if the read data and the program data are the same, the memory system may increase the counter value of a corresponding entry and register the PBA of the same entry with the L2P table of a corresponding LBA. In contrast, if the read data and the program data are not the same (i.e., when a hash collision is generated), the memory system may read actual data written in the PBAs of the memory device 550 and perform a comparison on the read data. In this case, if the two data is not the same (i.e., the data are miss-matched), the memory system may assign a new PBA to the host 590 and write the received program data in the memory device 550.

Figure 17:
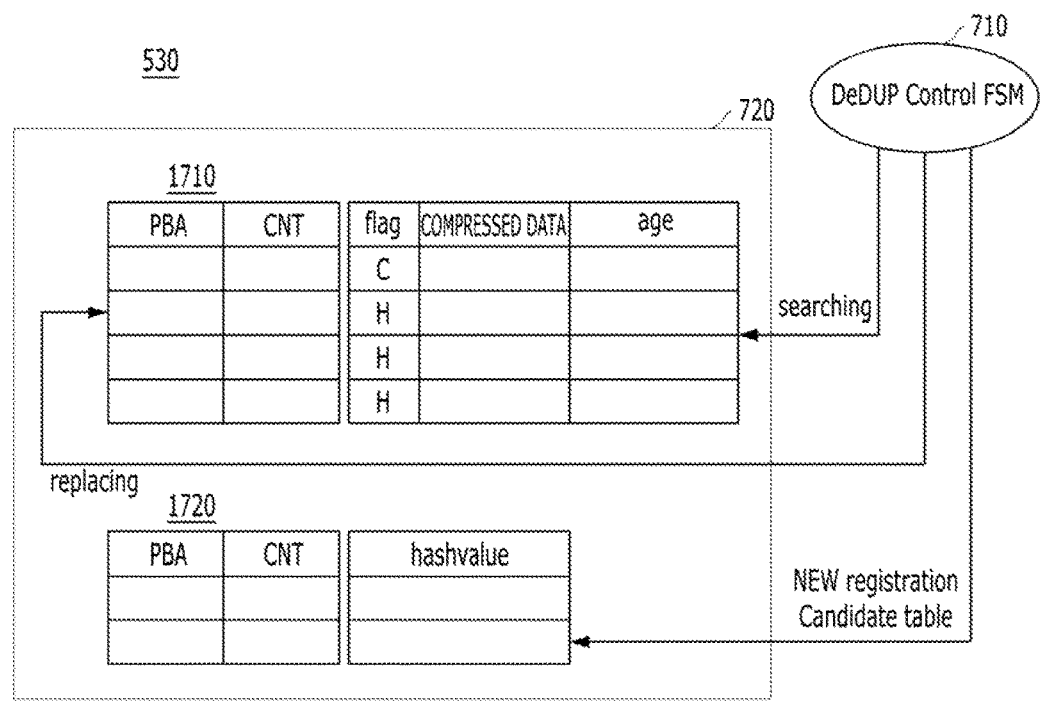
FIG. 17 is a diagram showing another exemplary deduplication table including finger print values set based on a lossless compression algorithm and a hash algorithm, in the memory system, in accordance with various embodiments of the present invention.

FIG. 17 is a diagram showing another exemplary deduplication table 720 including finger print values set based on a lossless compression algorithm and a hash algorithm in a memory system, in accordance with various embodiments of the present invention.

Referring to FIG. 17, the deduplication manager 530 may include a management controller 710 and the deduplication table 720. The management controller 710 may be configured to perform a data compression operation, a duplication search operation and a registration operation. The management controller 710 may include a lossless compression unit (or a lossless compression algorithm) for performing a compression operation and a hash generation unit (or a hash algorithm). When program data is received, the management controller 710 may convert the program data into lossless compressed data and a hash value.

The deduplication table 720 may include a registration table 1710 and a new registration candidate table 1720. The registration table 1710 may further include compressed data (i.e., lossless compressed data and a hash value) and flag information to identify compressed data. For example, the deduplication table 720 may include a plurality of entries. A physical block address (PBA), a counter value (CNT), a flag to identify the type of compressed data, and compressed data may be registered with each of the entries. The flag may be a flag capable of indicating that compressed data is lossless compressed data or a hash value.

The management controller 710 may determine whether compressed data (i.e., lossless compressed data and a hash value) generated by converting program data is duplicated or not by searching the deduplication table 720. In accordance with an embodiment, first, the deduplication manager 530 may sequentially perform operations for generating lossless compressed data, determining whether the generated lossless compressed data is duplicated or not, obtaining a hash value if, as a result of the determination, it is determined that the lossless compressed data is not duplicated, and determining whether or not the obtained hash value is duplicated. In accordance with another embodiment, first, the deduplication manager 530 may sequentially perform operations for obtaining a hash value, determining whether the obtained hash value is duplicated or not, generating lossless compressed data if, as a result of the determination, it is determined that the obtained hash value is not duplicated, and determining whether the generated lossless compressed data is duplicated or not. In accordance with still another embodiment, the deduplication manager 530 may determine whether a hash value is duplicated or not if the duplication of lossless compressed data is not determined, and may newly register a hash value with the deduplication table 720 if the hash value is not duplicated.

Figure 18:
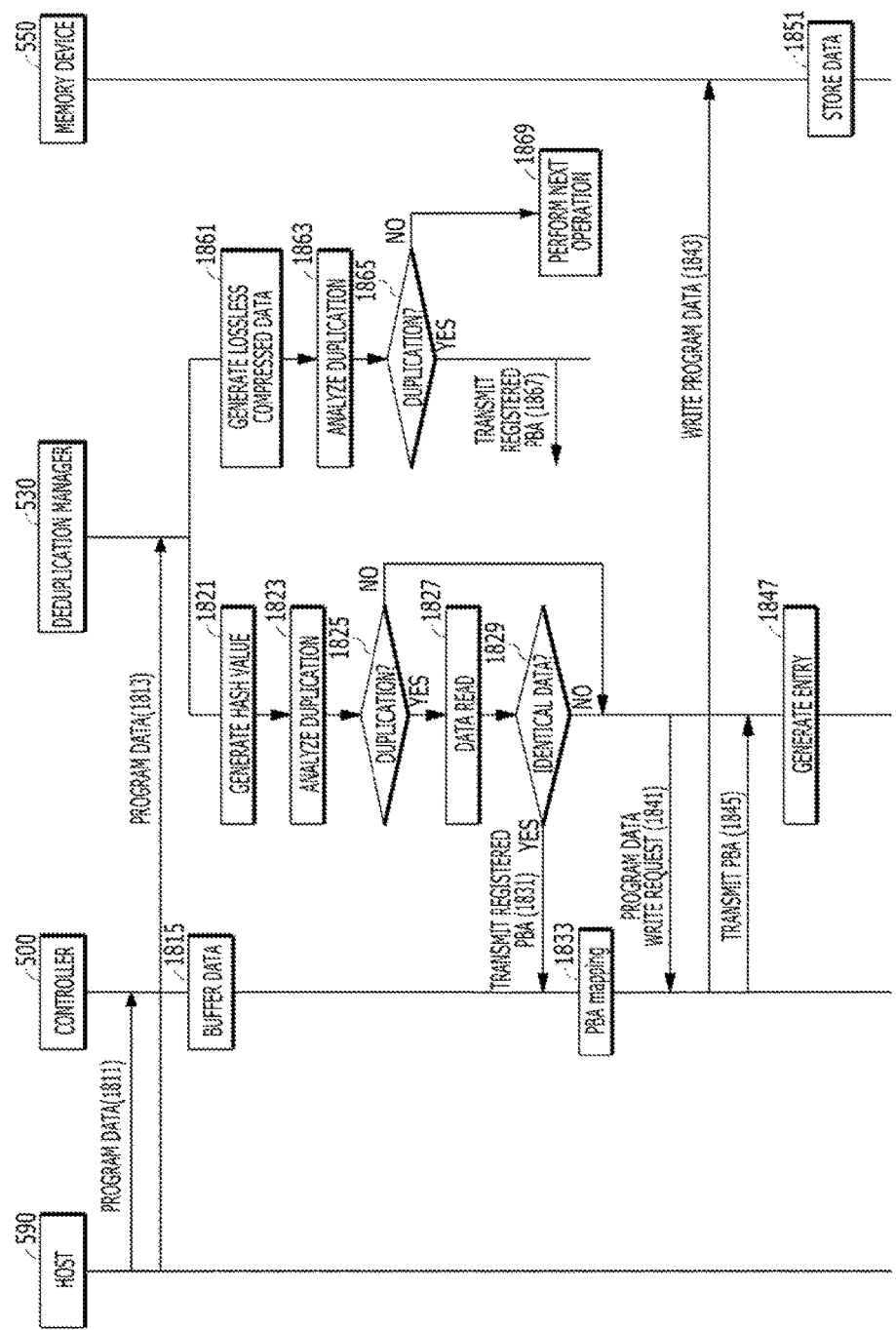
FIG. 18 is a flowchart illustrating an exemplary operation for checking whether lossless compressed data and a hash value are duplicated or not and writing program data in the memory system, in accordance with various embodiments of the present invention.

FIG. 18 is a flowchart illustrating an exemplary operation for checking whether or not lossless compressed data and a hash value are duplicated and writing program data in the memory system, in accordance with various embodiments of the present invention.

Referring to FIG. 18, the host 590 may transfer program data to the controller 500. The controller 500 may receive the program data at step 1811. The deduplication manager 530 may receive the program data at step 1813. The controller 500 may store the received program data in the buffer memory 540 at step 1815.

The deduplication manager 530 may generate hash data based on a hash algorithm using the received program data at step 1821, and may generate lossless compressed data based on a lossless compression algorithm at step 1861. A method for generating and processing the hash data is described below. The deduplication manager 530 may determine whether the program data is duplicated or not by analyzing the deduplication table 720 at step 1823. If, as a result of the determination, it is determined that the hash data is present in the deduplication table 720, the deduplication manager 530 may recognize such duplication at step 1825 (YES), may request data read from the controller 500, and may receive the read data from the controller 500 at step 1827. Thereafter, the deduplication manager 530 may determine whether the program data and the read data are the same by comparing the program data with the read data at step 1829. If, as a result of the determination, it is found that the program data and the read data are the same, the deduplication manager 530 may recognize that the two data is the same at step 1829 (YES) and may transmit information about a PBA, registered with the deduplication table 720, to the controller 500 at step 1831. The PBA transmitted to the controller 500 may be a PBA of the memory device 550 in which the same data as the received program data has been written. The controller 500 may map the received PBA to a corresponding LBA of an L2P table at step 1833. When the PBA is received from the deduplication manager 530, the controller 500 may not perform an operation for writing the program data in the memory device 550.

If, as a result of the determination, it is found that the program data and the read data are not the same (step 1829, NO), the deduplication manager 530 may request the write of the program data from the controller 500 at step 1841. When the write request of the program data is received, the controller 500 may instruct the memory device 550 to write the program data by assigning a new PBA at step 1843. The memory device 550 may write the program data in the assigned PBA at step 1851.

The controller 500 may transmit the PBA of the program data to the deduplication manager 530 at step 1845. The deduplication manager 530 may set an empty entry or replaceable entry in the deduplication table 720 at step 1847, and may newly register the hash value and PBA of the program data with the set entry.

Furthermore, the deduplication manager 530 may generate lossless compressed data at step 1861, and may determine whether the generated lossless compressed data is duplicated or not by searching the deduplication table 720 for the lossless compressed data at step 1863. If, as a result of the search, it is found that the lossless compressed data is present in the deduplication table 720 (step 1865, YES), the deduplication manager 530 may recognize that the lossless compressed data is present at step 1865, and may register information about a corresponding PBA (or information about an address of the buffer memory) with a corresponding entry and transmit the PBA to the controller 500 at step 1867. Accordingly, the controller 500 may map the PBA (or the information about the address of the buffer memory), registered with the corresponding entry, to an L2P table without performing an operation for writing the program data. If, as a result of the search, it is found that the lossless compressed data is not present in the deduplication table 720 at step 1865 (NO), the deduplication manager 530 may perform a next operation at step 1869. For example, the deduplication manager 530 may terminate the write operation based on the lossless compressed data. For example, the deduplication manager 530 may proceed to an operation for generating a hash value. For example, the deduplication manager 530 may request the write of the program data from the controller 500.

Figure 19:
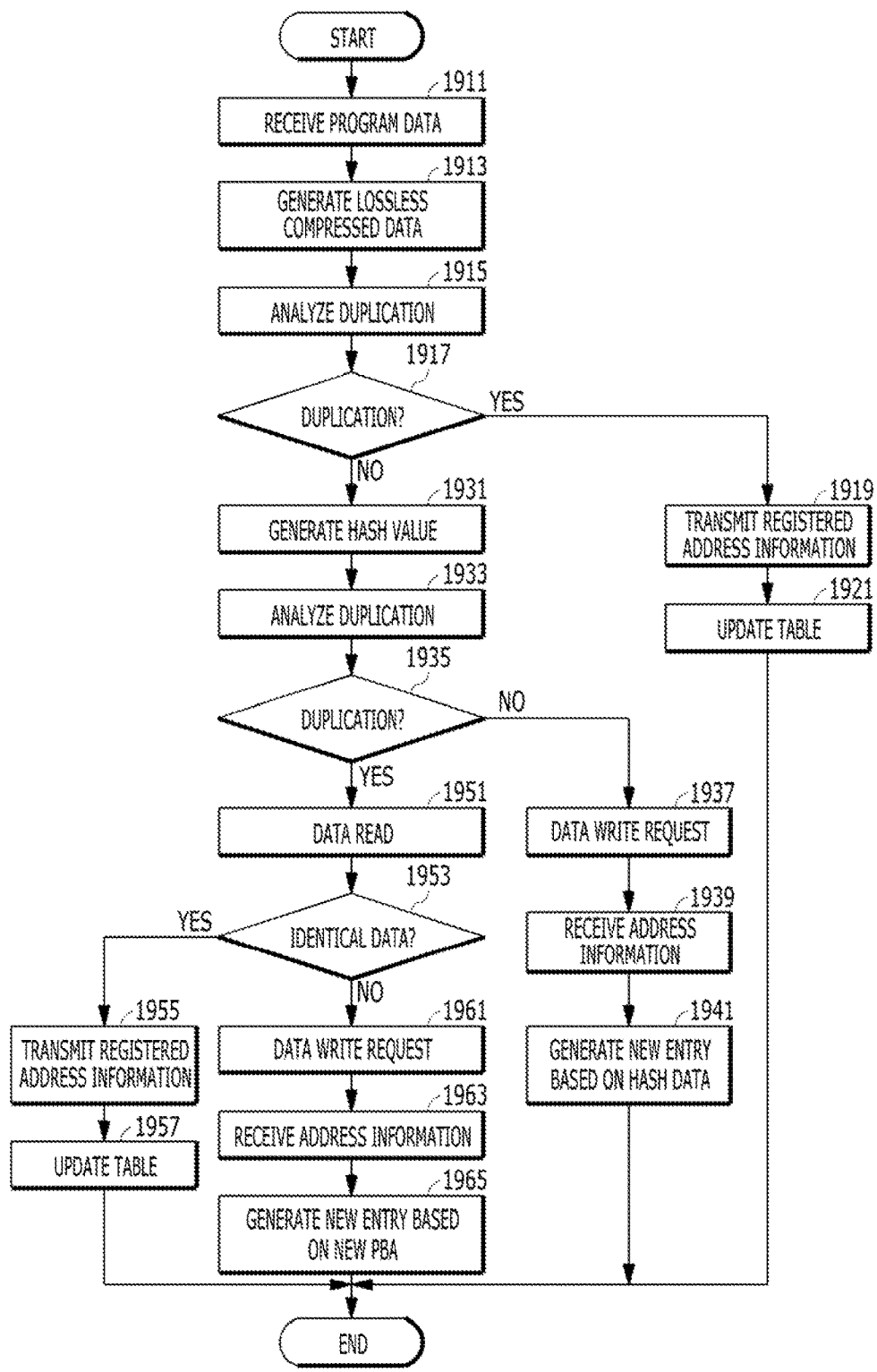
FIG. 19 is a flowchart illustrating an exemplary operation for sequentially searching for, by the memory system, lossless compressed data and hash data and writing program data, in accordance with various embodiments of the present invention.

FIG. 19 is a flowchart illustrating an exemplary operation for sequentially searching for, by the memory system, loss-less compressed data and hash data and writing program data in accordance with various embodiments of the present invention.

Referring to FIG. 19, the memory system may determine whether program data is duplicated or not using compressed data generated by a plurality of compression algorithms using the program data. For example, the memory system may convert the program data into the compressed data using a lossless compression algorithm and a hash algorithm. If a plurality of compression algorithms is used, the memory system may convert the program data into the compressed data based on priority. For example, when program data is received, first, the memory system may determine whether lossless compressed data generated by a lossless compression algorithm is duplicated or not. If, as a result of the determination, it is determined that the lossless compressed data is not duplicated, the memory system may determine whether a hash value generated by a hash algorithm is duplicated or not. On the contrary, first, the memory system may determine whether a hash value generated by a hash algorithm is duplicated or not. If, as a result of the determination, it is determined that the hash value is not duplicated, the memory system may determine whether lossless compressed data generated by a lossless compression algorithm is duplicated or not.

If a plurality of compression algorithms is used, the memory system may update the deduplication table 720 based on compressed data generated by one of the compression algorithms. For example, the memory system may determine only whether lossless compressed data is duplicated or not, may determine whether a hash value is duplicated or not, and may update the deduplication table 720 based on a result of the determinations. On the contrary, the memory system may determine only whether a hash value is duplicated or not, may determine whether lossless compressed data is duplicated or not, and may update the deduplication table 720 based on a result of the determinations.

FIG. 19 may be a flowchart illustrating an example in which when program data is received, the deduplication manager 530 determines whether the program data is duplicated or not based on priorities of lossless compressed data and a hash value and updates the deduplication table 720 based on the hash value. The deduplication table 720 of the deduplication manager 530 may include entries in which the lossless compressed data and hash value of data written in the memory device 550 are stored. Each of the entries may include a hash value or lossless compressed data, a flag for distinguishing the hash value and the lossless compressed data, information about an address of memory in which data has been written (e.g., a PBA of the memory device 550 or information about an address of the buffer memory 540), and information about the write request number (or counter value) of the data.

When program data is received at step 1911, the deduplication manager 530 may generate the lossless compressed data for the program data based on a lossless compression algorithm at step 1193. At step 1915, the deduplication manager 530 may analyze whether the lossless compressed data is duplicated or not by searching the deduplication table 720 for the lossless compressed data. If, as a result of the search at step 1917, it is found that the lossless compressed data is present in the deduplication table 720 (YES), the deduplication manager 530 may determine that the lossless compressed data is duplicated and may transmit information about an address registered with a corresponding entry to the controller 500 at step 1919. The controller 500 may map the received address information to an LBA of the program data within an L2P table. In this case, the address information may be a PBA of the memory device 550 or an address value of the buffer memory 540. The deduplication manager 530 may update information about the corresponding entry in the deduplication table 720 at step 1921. For example, the updated information may include the update of the write request number (or counter value) of the duplicated program data.

If, as a result of the search at step 1917, it is found that the lossless compressed data is not present in the deduplication table 720 (NO), the deduplication manager 530 may recognize that the lossless compressed data is not present and generate a hash value based on a hash algorithm at step 1931. At step 1933, the deduplication manager 530 may analyze whether the hash value is duplicated or not by searching the deduplication table 720 for the hash value. If, as a result of the search at step 1935, it is found that the hash value is present in the deduplication table 720 (YES), the deduplication manager 530 may determine that the hash value is duplicated and may transmit information about an address (e.g., a PBA) registered with a corresponding entry of the deduplication table 720 to the controller 500. Furthermore, the deduplication manager 530 may receive the data of the corresponding address information read by the controller 500 at step 1951. When the read data is received from the controller 500, the deduplication manager 530 may compare the program data with the read data at step 1953. If, as a result of the comparison at step 1953, it is found that the program data and the read data are the same data (YES), the deduplication manager 530 may recognize that the program data and the read data are the same data, may transmit the address information registered with the entry to the controller 500 at step 1955, and may update information about the entry at step 1957.

If, as a result of the comparison at step 1953, it is found that the program data and the read data are not the same data (NO), the deduplication manager 530 may request data write from the controller 500 at step 1961. When information about the address of the written data is received from the controller 500 at step 1963, the deduplication manager 530 may register a new entry, including the hash value and the address information, with the deduplication table 720 at step 1965. In such a case, the deduplication table 720 may include a plurality of entries having the same hash value. Each of the entries may have different pieces of address information (e.g., PBAs) and different counter values. In an embodiment, the deduplication manager 530 may omit steps 1963 and 1965. In such a case, the deduplication manager 530 may not perform an operation for registering the new entry if the program data and the read data are different in the state in which the hash value has been duplicated.

Furthermore, if, as a result of the search at step 1935, it is found that the hash value is not present in the deduplication table 720 (NO), the deduplication manager 530 may request data write from the controller 500 at step 1937. When information about the address of the written data is received from the controller 500 at step 1939, the deduplication manager 530 may register a new entry, including the hash value and the address information, with the deduplication table 720 at step 1941. The operations of steps 1939 to 1941 may be performed like a method, such as that of FIG. 13.

Figure 20:
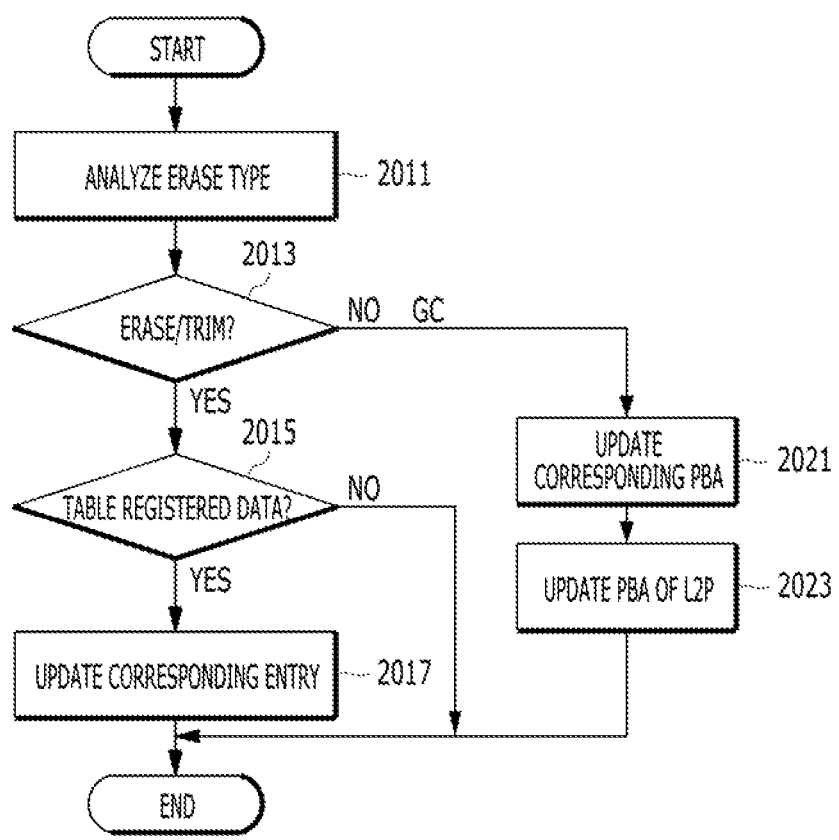
FIG. 20 is a flowchart illustrating an exemplary operation for updating information about the deduplication table based on erase in the memory system, in accordance with various embodiments of the present invention.

FIG. 20 is a flowchart illustrating an exemplary operation for updating information about the deduplication table 720 based on erase in the memory system in accordance with various embodiments of the present invention.

Referring to FIG. 20, when the erase operation of the memory device 550 is executed under the control of the controller 500, the deduplication manager 530 may update pieces of information included in the deduplication table 720. An erase type may be erase/trim, garbage collection (GC) or the like. Trim may be a function for checking a garbage file deleted in an operating system and erasing corresponding written data from the memory device 550. Erase according to trim may be performed immediately when the controller 500 provides notification of deletion in an operating system or may use a method for memorizing, by the controller 500, the time and performing deletion at a proper time. GC may be a function for performing erasing processing on garbage pages (e.g., garbage pages generated through ware-leveling). The memory system may perform erase processing on data written in the memory device 550 according to an erase type when an erase command is generated, and may update the deduplication table 720 with a result of the erase processing.

When an erase command is generated, the memory system may analyze an erase type at step 2011. If, as a result of the analysis at step 2013, it is found that the erase type is erase/trim (YES), the memory system may recognize that the erase type is erase/trim, and may check whether a PBA paired with an LBA requested by erase/trim has been registered with the deduplication table 720 as an entry at step 2015. If, as a result of the check, it is found that the PBA paired with the LBA requested by erase/trim has been registered with the entry of the deduplication table 720, the memory system may recognize this and update information about the corresponding entry of the deduplication table 720 (e.g., decrease a corresponding counter value (CNT-1)) at step 2017. Furthermore, if, as a result of the check at step 2015, it is found that the PBA paired with the LBA requested by erase/trim has not been registered with the entry of the deduplication table 720, the memory system may recognize this and perform a normal erase operation. The normal operation may mean an operation for erasing, by the controller 500, data written in a corresponding PBA of the memory device 550 and updating the L2P table.

A counter value included in each of the entries of the deduplication table 720 may be the write number of corresponding program data. Accordingly, when an erase command is generated, the memory system may control the erase operation of the memory device 550 based on information registered with the deduplication table 720. If a PBA whose erase has been requested has been registered with the deduplication table 720, the memory system checks a counter value of the entry with which the corresponding PBA has been registered at step 2017. If, as a result of the check, it is found that the counter value is 2 or higher, it means that there is another program data whose write has been requested. In such a case, the memory system may perform control so that the counter value of the corresponding entry is decreased at step 2017, and may erase information about a corresponding LBA in the L2P table. Furthermore, if, as a result of the check, it is found that the counter value of the entry with which the corresponding PBA has been registered is 1, it may mean that duplicated data is no longer present. In such a case, the memory system may delete a corresponding entry from the deduplication table 720 and erase an LBA of the L2P table and data written in the corresponding PBA of the memory device 550.

Furthermore, if the erase type is GC and a PBA paired with an LBA requested by GC has been registered with the deduplication table 720 as an entry at step 2013, the memory system may recognize this, may update the entry of the deduplication table 720 with which the corresponding PBA has been registered at step 2021, and may also update information included in the L2P table at step 2023. When a GC command is generated, the controller 500 may read GC and write data in the memory device 550 as a new PBA. In this case, if the PBA of the data written by GC has been registered with the deduplication table 720, the controller 500 may notify the deduplication manager 530 of the registration. Accordingly, the deduplication manager 530 may update PBA information of the entry with which the corresponding PBA has been registered in the deduplication table 720. Furthermore, the controller 500 may update the PBA values of the L2P table with the new PBA based on the updated PBA. To this end, if a P2L table in which a PBA to an LBA are mapped and managed is present, the memory system may update each L2P table with a PBA updated by GC. In this case, an update operation performed by the memory system may be performed by the counter value of an entry that is managed in the deduplication table 720.

The memory system can determine whether duplication is present by reading the memory device 550 in background. If there is a limit to the deduplication table 720 or write requests that exceed a temporal locality range continue to be replaced, registration with the deduplication table 720 may be impossible. For example, if other hash values are mixed and received at a long interval, the memory system may register the hash values although there is generally duplication and may not maintain the hash values. For such cases, the memory system may perform a background operation (or background deduplication processing). The controller 500 may execute a hash algorithm upon reclaim in a GC operation performed during an idle time, and may determine whether duplication is present or not by searching for the entries of the deduplication table 720. If, as a result of the determination, it is determined that duplication is present, the memory system may increase the counter value of a corresponding entry, may not perform a data write operation in the reclaim, may remove corresponding data, and may update only the L2P table.

The memory system can have a write amplification (WA) reduction effect according to deduplication management. The memory system may determine whether program data is duplicated or not, and may not perform a write operation by the number of packets that are retrieved as being duplicated. As the number of entries of the deduplication table increases and according to a probabilistic distribution of data duplication that appears in the workload of the host, there may be a difference in the WA reduction influence. For example, assuming that hash entries corresponding to half of the entire memory device (storage) in the deduplication table can be managed and a host uses a memory device (storage) by bisecting it into two identical copies, the memory device can be managed although even half of total host write data has been programmed into the memory device. As a result, there is an advantage in that a degree of wear of the memory system can be reduced.

As described above, the apparatus and method for controlling a memory device in accordance with various embodiments of the present invention can determine whether data duplication of data written in a memory device exists and can eliminate a data write operation for duplicate data. Accordingly, the lifespan and performance of a memory device can be improved because the memory system eliminates unnecessary data write operations.

Hereinbelow, detailed descriptions will be made with reference to FIGS. 21 to 26, of electronic devices employing a memory system, according to various embodiments of the present invention.

Figure 21:
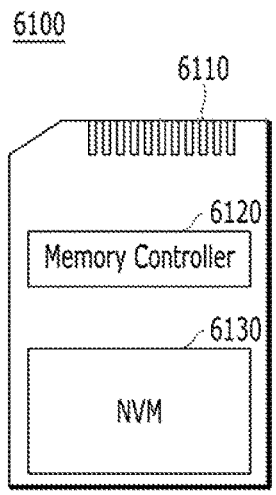
FIGS. 21 to 26 illustrate various examples of a data processing system including a memory system, according to various embodiments of the present invention.

FIG. 21 is a diagram illustrating an example of a data processing system including a memory system according to an embodiment of the present invention. Specifically, FIG. 21 illustrates a memory card system 6100 employing a memory system, according to an embodiment of the present invention.

Referring now to FIG. 21, the memory card system 6100 is provided, according to an embodiment of the present invention.

The memory card system 6100 may include a memory controller 6120, a memory device 6130, and a connector 6110.

The memory controller 6120 may be operatively connected with the memory device 6130. The memory controller 6120 may access the memory device 6130 for controlling the operations of the memory device 6130. For example, the memory controller 6120 may control the read, write, erase and background operations of the memory device 6130. The memory controller 6120 is also configured to provide an interface between the memory device 6130 and a host via the connector 6110. The memory controller may drive a firmware for controlling the memory device 6130.

The memory controller 6120 may correspond to the controller 130 and 500 described above with reference to FIGS. 1 and 5, and the memory device 6130 may correspond to the memory device 150 and 550 described above with reference to FIGS. 1 and 6.

Therefore, the memory controller 6120 may include components such as a random access memory (RAM), a processing unit, a host interface, a memory interface and an error correction unit.

The memory controller 6120 may communicate with an external device, for example, the host 102 described above with reference to FIG. 1, through the connector 6110. For example, as described above with reference to FIG. 1, the memory controller 6120 may be configured to communicate with the external device through at least one of various communication protocols such as a universal serial bus (USB), a multimedia card (MMC), an embedded MMC (eMMC), a peripheral component interconnection (PCI), a PCI express (PCI-e), an Advanced Technology Attachment (ATA), a Serial-ATA, a Parallel-ATA, a small computer system interface (SCSI), an enhanced small disk interface (ESDI), an Integrated Drive Electronics (IDE), a Firewire, universal flash storage (UFS), wireless-fidelity (WI-FI) and a Bluetooth. The memory system and the data processing system may be applied to wired and/or wireless electronic appliances, for example, a mobile electronic appliance.

The memory device 6130 may be a nonvolatile memory (NVM). For example, the memory device 6130 may be implemented with one of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-MRAM).

The memory card may be configured, for example, as a PC card (e.g., Personal Computer Memory Card International Association (PCMCIA)), a compact flash card (CF), a smart media card (e.g., SM and SMC), a memory stick, a multimedia card (e.g., MMC, RS-MMC, MMCmicro and eMMC), an SD card (SD, miniSD, microSD and SDHC) and a universal flash storage (UFS).

Figure 22:
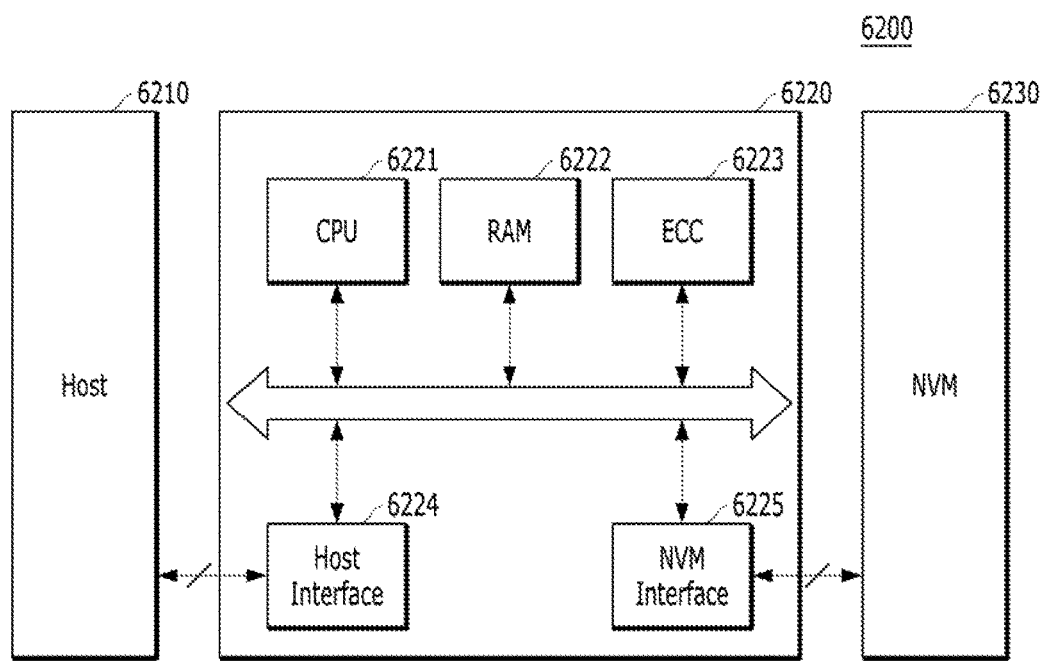

FIG. 22 is a diagram illustrating another example of a data processing system 6200 including a memory system, according to an embodiment of the present invention.

Referring to FIG. 22, the data processing system 6200 may include a memory device 6230 which is implemented by at least one nonvolatile memory NVM and a memory controller 6220 which controls the memory device 6230. The data processing system 6200 may be a storage medium such as a memory card (e.g., a CF, a SD or a microSD), as described above with reference to FIG. 1. The memory device 6230 may correspond to the memory device 150 and 550 described above with reference to FIGS. 1 and 6. The memory controller 6220 may correspond to the controller 130 and 500 described above with reference to FIGS. 1 and 5.

The memory controller 6220 may control the operations for the memory device 6230 including read, write and erase operations in response to commands received from a host 6210. The memory controller 6220 may include at least one of a central processing unit (CPU) 6221, a random access memory (RAM) as a buffer memory 6222, an error correction code (ECC) circuit 6223, a host interface 6224, and an NVM interface 6225 as a memory interface, all electrically coupled via an internal bus.

The CPU 6221 may control the operations for the memory device 6230, for example, read, write, file system management, bad page management, and so forth. The RAM 6222 may operate according to control of the CPU 6221, and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 may be used to buffer data to be transmitted from the host 6210 to the memory device 6230 or from the memory device 6230 to the host 6210. In the case where the RAM 6222 is used as a cache memory, the RAM 6222 may be used to enable the memory device 6230 of a low speed to operate at a high speed.

The ECC circuit 6223 may correspond to the ECC unit 138 of the controller 130 described above with reference to FIG. 1. As described above with reference to FIG. 1, the ECC circuit 6223 generates an error correction code (ECC) for correcting a fail bit or an error bit in the data received from the memory device 6230. Also, the ECC circuit 6223 may perform error correction encoding for data to be provided to the memory device 6230, and generate data added with parity bits. The parity bits may be stored in the memory device 6230. The ECC circuit 6223 may perform error correction decoding for data outputted from the memory device 6230. At this time, the ECC circuit 6223 may correct errors by using the parity bits. For example, as described above with reference to FIG. 1, the ECC circuit 6223 may correct errors by using one of various coded modulations such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM) and a Block coded modulation (BCM).

The memory controller 6220 may transmit and receive data to and from the host 6210 through the host interface 6224, and transmit and receive data to and from the memory device 6230 through the NVM interface 6225. The host interface 6224 may be connected with the host 6210 through a parallel advanced technology attachment (PATA) bus, a serial advanced technology attachment (SATA) bus, a small computer system interface (SCSI), a universal serial bus (USB), a peripheral component interconnection express (PCI-e) or a NAND interface. Further, as a wireless communication function or a mobile communication protocol such as wireless fidelity (WI-FI) or long term evolution (LTE) is implemented, the memory controller 6220 may transmit and receive data by being connected with an external device, for example, the host 6210 or another external device other than the host 6210. Specifically, as the memory controller 6220 is configured to communicate with an external device through at least one among various communication protocols, the memory system and the data processing system according to the embodiment may be applied to wired and/or wireless electronic appliances, for example, a mobile electronic appliance.

Figure 23:
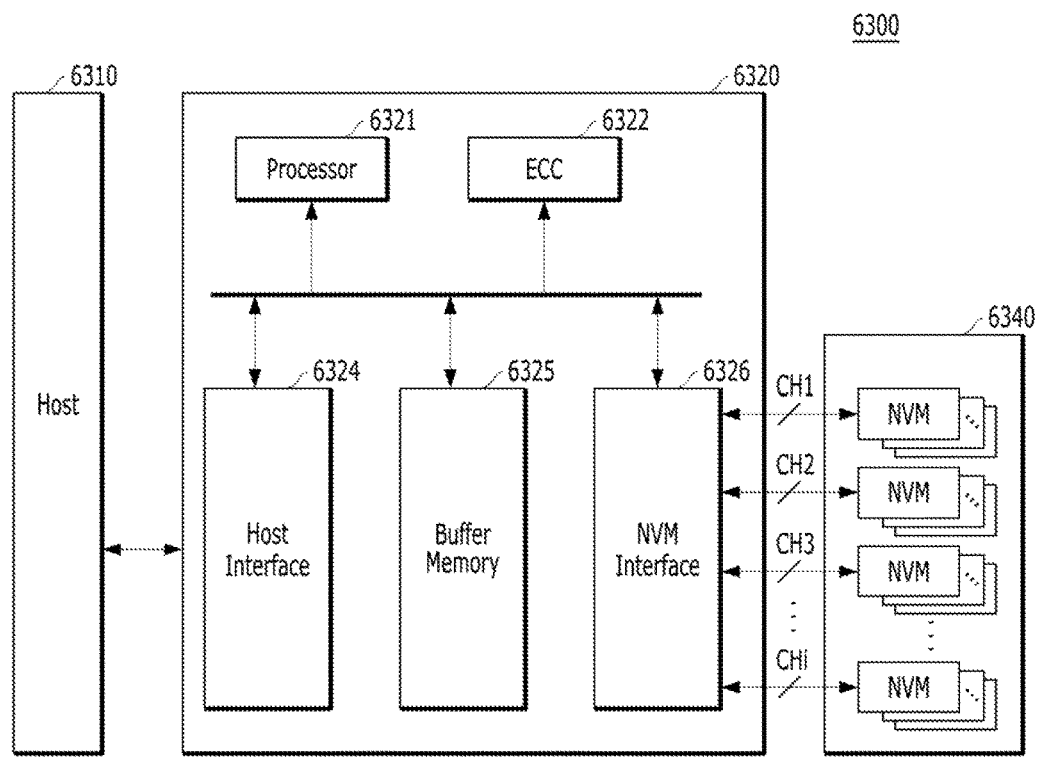

FIG. 23 is a diagram illustrating another example of a data processing system including a memory system according to an embodiment of the present invention. For example, in FIG. 23, a solid state drive (SSD) 6300 employing a memory system is shown.

Referring to FIG. 23, the SSD 6300 may include a memory device 6340 which includes a plurality of nonvolatile memories NVM, and a controller 6320. The controller 6320 may correspond to the controller 130 and 500 described above with reference to FIGS. 1 and 5. The memory device 6340 may correspond to the memory device 150 and 550 described above with reference to FIGS. 1 and 6.

The controller 6320 may be connected with the memory device 6340 through a plurality of channels CH1, CH2, CH3, . . . and CHi. The controller 6320 may include at least one processor 6321, a buffer memory 6325, an error correction code (ECC) circuit 6322, a host interface 6324, and a memory interface, for example, a nonvolatile memory (NVM) interface 6326.

The buffer memory 6325 may temporarily store data received from a host 6310 or data received from a plurality of nonvolatile memories NVM included in the memory device 6340, or temporarily store metadata of the plurality of nonvolatile memories NVM, for example, map data including mapping tables. The buffer memory 6325 may be implemented by a volatile memory such as, but not limited to, a dynamic random access memory (DRAM), a synchronous dynamic random access memory (SDRAM), a double data rate (DDR) SDRAM, a low power double data rate (LPDDR) SDRAM and a graphic random access memory (GRAM) or a nonvolatile memory such as, but not limited to, a ferroelectric random access memory (FRAM), a resistive random access memory (ReRAM), a spin-transfer torque magnetic random access memory (STT-MRAM) and a phase change random access memory (PRAM). While it is illustrated in FIG. 21, as an example, that the buffer memory 6325 is disposed inside the controller 6320, it is noted that the buffer memory 6325 may be disposed outside the controller 6320.

The ECC circuit 6322 may calculate error correction code values of data to be programmed in the memory device 6340 in a program operation, perform an error correction operation for data read from the memory device 6340, based on the error correction code values, in a read operation, and perform an error correction operation for data recovered from the memory device 6340 in a recovery operation for failed data.

The host interface 6324 may provide an interface function with respect to an external device, for example, the host 6310. The nonvolatile memory interface 6326 may provide an interface function with respect to the memory device 6340 which is connected through the plurality of channels CH1, CH2, CH3, . . . and CHi.

In an embodiment, a redundant array of independent disks (RAID) system is provided the system including a plurality of SSDs 6300. Each SSD 6300 may employ the memory system 110 described above with reference to FIG. 1. In a RAID system, the plurality of SSDs 6300 and a RAID controller for controlling the plurality of SSDs 6300 may be included. In the case of performing a program operation by receiving a write command from the host 6310, the RAID controller may select at least one memory system, that is, at least one SSD 6300, in correspondence to the RAID level information of the write command received from the host 6310, among a plurality of RAID levels, that is, the plurality of SSDs 6300, and may output data corresponding to the write command, to the selected SSD 6300. Also, in the case of performing a read operation by receiving a read command from the host 6310, the RAID controller may select at least one memory system, that is, at least one SSD 6300, in correspondence to the RAID level information of the write command received from the host 6310, among the plurality of RAID levels, that is, the plurality of SSDs 6300, and may provide data outputted from the selected SSD 6300, to the host 6310.

Figure 24:
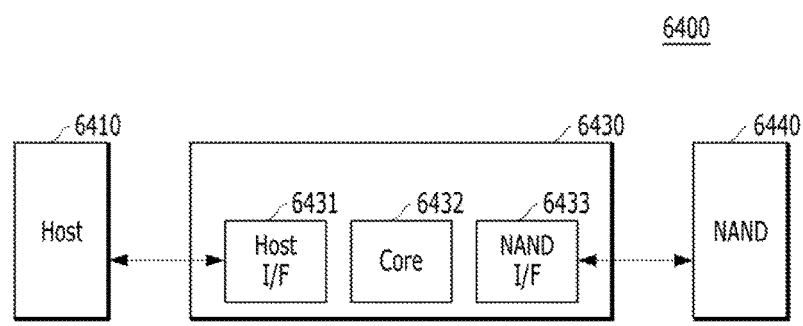

FIG. 24 is a diagram illustrating another example of a data processing system including a memory system, according to an embodiment of the present invention. For example, in FIG. 24, an embedded multimedia card (eMMC) 6400 employing a memory system is shown.

Referring to FIG. 24, the eMMC 6400 may include a memory device 6440 which is implemented by at least one NAND flash memory, and a controller 6430. The controller 6430 may correspond to the controller 130 and 500 described above with reference to FIGS. 1 and 5. The memory device 6440 may correspond to the memory device 150 and 550 described above with reference to FIGS. 1 and 6.

The controller 6430 may be connected with the memory device 6440 through a plurality of channels. The controller 6430 may include a core 6432, a host interface 6431, and a memory interface, for example, a NAND interface 6433.

The core 6432 may control the operations of the eMMC 6400. The host interface 6431 may provide an interface function between the controller 6430 and a host 6410. The NAND interface 6433 may provide an interface function between the memory device 6440 and the controller 6430. For example, the host interface 6431 may be a parallel interface, for example, an MMC interface, as described above with reference to FIG. 1, or may be a serial interface, for example, an ultra-high speed class 1 (UHS)-I/UHS class 2 (UHS-II) and a universal flash storage (UFS) interface.

Figure 25:
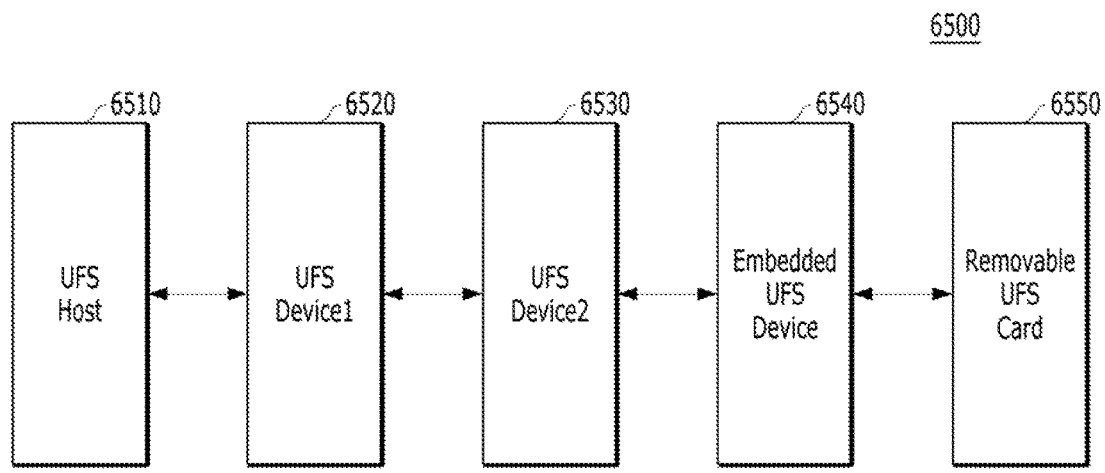

FIG. 25 is a diagram illustrating another example of a data processing system including a memory system, according to an embodiment of the present invention. For example, FIG. 25 illustrates a universal flash storage (UFS) to which the memory system according to an embodiment of the invention is applied.

Referring to FIG. 25, the UFS system 6500 may include a UFS host 6510, a plurality of UFS devices 6520 and 6530, an embedded UFS device 6540, and a removable UFS card 6550. The UFS host 6510 may be an application processor of wired and/or wireless electronic appliances, for example, a mobile electronic appliance.

The UFS host 6510, the UFS devices 6520 and 6530, the embedded UFS device 6540 and the removable UFS card 6550 may respectively communicate with external devices such as wired and/or wireless electronic appliances (for example, a mobile electronic appliance), for example, through a UFS protocol. The UFS devices 6520 and 6530, the embedded UFS device 6540 and the removable UFS card 6550 may be implemented as the memory system 110 described above with reference to FIG. 1, for example, as the memory card system 6100 described above with reference to FIG. 21. The embedded UFS device 6540 and the removable UFS card 6550 may also communicate through another protocol other than the UFS protocol. For example, the embedded UFS device 6540 and the removable UFS card 6550 may communicate through various card protocols, for example, but not limited to, USB flash drives (UFDs), multimedia card (MMC), secure digital (SD), mini SD and Micro SD.

Figure 26:
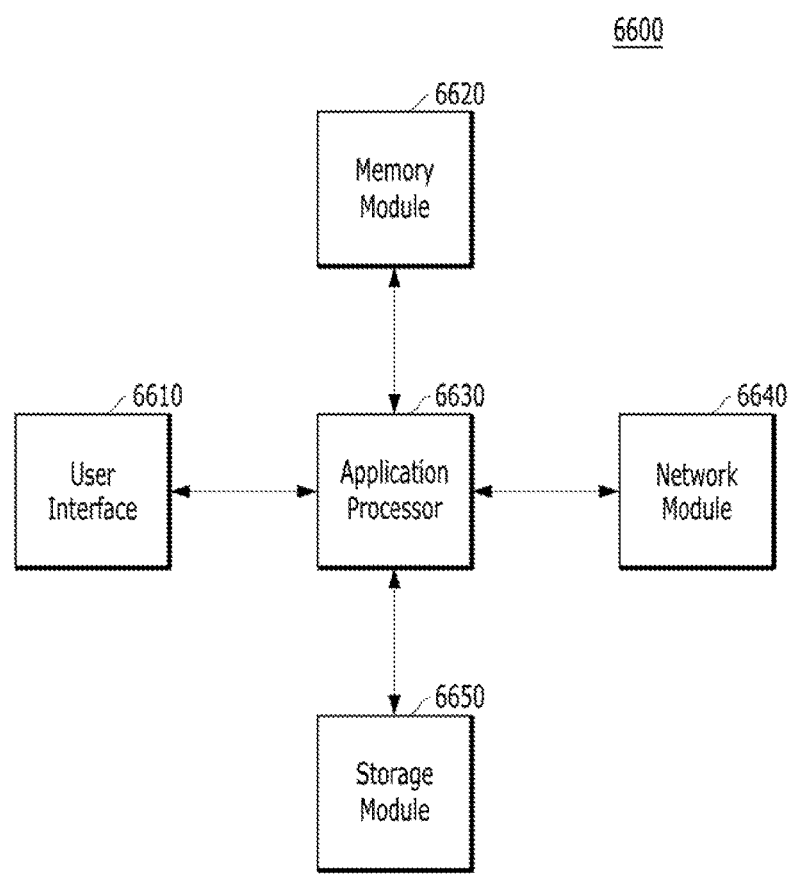

FIG. 26 is a diagram illustrating another example of a data processing system including a memory system according to an embodiment of the present invention. For example, in FIG. 26, a user system 6600 employing the memory system is shown.

Referring to FIG. 26, the user system 6600 may include a user interface 6610, a memory module 6620, an application processor 6630, a network module 6640, and a storage module 6650.

The application processor 6630 may drive components included in the user system 6600 and an operating system (OS). For example, the application processor 6630 may include controllers for controlling the components included in the user system 6600, interfaces, graphics engines, and so on. The application processor 6630 may be provided by a system-on-chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), and so on, and may thereby communicate with wired and/or wireless electronic appliances. For example, a mobile electronic appliance. Accordingly, the memory system and the data processing system may be applied to wired and/or wireless electronic appliances. The network module 6640 may be included in the application processor 6630.

The storage module 6650 may store data, for example, data received from the application processor 6630, and transmit data stored therein, to the application processor 6630. The storage module 6650 may be implemented by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. The storage module 6650 may be provided as a removable storage medium such as a memory card of the user system 6600 and an external drive. For example, the storage module 6650 may correspond to the memory system 110 described above with reference to FIG. 1, and may be implemented as the SSD, eMMC and UFS described above with reference to FIGS. 23 to 25.

The user interface 6610 may include interfaces for inputting data or commands to the application processor 6630 or for outputting data to an external device. For example, the user interface 6610 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

In the case where the memory system 110 described above with reference to FIG. 1 is applied to the mobile electronic appliance of the user system 6600 according to an embodiment, the application processor 6630 may control the operations of the mobile electronic appliance, and the network module 6640 as a communication module controls wired and/or wireless communication with an external device, as described above. The user interface 6610 as the display/touch module of the mobile electronic appliance displays data processed by the application processor 6630 or supports input of data from a touch panel.

Although various embodiments have been described for illustrative purposes, it will be apparent to those skilled in the art that various changes and modifications may be made without departing from the spirit and scope of the invention as defined in the following claims.

What is claimed is:

1. An apparatus for controlling memory, the apparatus comprising:
    a memory device; and
    a controller functionally coupled to the memory device;
    a deduplication table for storing compressed data, a physical block address of the memory device in which non-compressed data corresponding to the compressed data has been written and a count value indicative of a write number of the data,
    wherein the controller is suitable for:
        compressing program data of a logical block address received in a data write operation;
        searching for the compressed data in the deduplication table;
        if the compressed data is new, writing the program data in the physical block address of the memory device; and
        registering a new entry comprising the compressed data and the physical block address with the deduplication table, the compressed data comprising a hash value obtained by a hash algorithm,
    wherein the controller is suitable for:
        converting the program data with the logical block address into a hash value;
        reading data stored in the physical block address of the memory device mapped to a retrieved hash value if the hash value is searched for in the deduplication table;
        comparing the program data with the read data;
        assigning another physical block address for writing the program data in the memory device if, as a result of the comparison, it is determined that the program data and the read data are different;
        writing the program data in the assigned another physical block address of the memory device; and
        additionally registering a new entry comprising the hash value and said another physical block address with the deduplication table, and
    wherein the controller is suitable for:
        selecting the physical block address mapped to a hash value having a greatest counter value if data is searched for in the deduplication table;
        reading data written in the physical block address of the memory device;
        selecting another physical block address mapped to a hash value having a counter value of next priority if read data is different from the program data; and
        reading data written in said another physical block address of the memory device.

2. The apparatus of claim 1, wherein the controller is suitable for:
    converting the program data with the logical block address into a hash value;
    reading data stored in the physical block address of the memory device mapped to the retrieved hash value if the hash value is searched for in the deduplication table; and
    mapping the physical block address to the logical block address if the received program data and the read data are identical.

3. The apparatus of claim 2, wherein the controller is suitable for:
    assigning the physical block address for writing the program data in the memory device;
    writing the program data in the assigned physical block address of the memory device if the program data and the read data are different; and
    mapping the assigned physical block address to the first logical block address.

4. The apparatus of claim 2, wherein the controller is suitable for:
    when an erase command is generated, checking a physical block address mapped to a logical block address of erase data; and
    updating information about a corresponding entry if, as a result of the check, it is determined that the physical block address has been registered with the deduplication table.

5. The apparatus of claim 4, wherein the controller is suitable for:
    checking a counter value of an entry with which the physical block address has been registered if an erase type is erase/trim;
    decreasing the counter value of the entry if, as a result of the check, it is determined that the counter value is 2 or higher; and
    deleting the entry and erasing the data written in the physical block address of the memory device if, as a result of the check, it is found that the counter value is 1.

6. The apparatus of claim 5, wherein the controller is suitable for:
    writing data in a changed physical block address of the memory device if the erase type is a garbage collection; and updating the deduplication table by registering the changed physical block address with a corresponding entry of the deduplication table.

7. An apparatus for controlling memory, comprising:
a memory device; and
a controller functionally coupled to the memory device, and including a deduplication table for storing lossless compressed data and a first address of the memory device in which non-compressed data corresponding to the lossless compressed data is stored,
wherein the controller is suitable for:
lossless compressing received program data with a second address;
mapping the first address of retrieved lossless compressed data to the second address if the lossless compressed data is searched for in the deduplication table; and
not writing the program data in the memory device for the received program data.

8. The apparatus of claim 7,
wherein the controller is further suitable for:
searching the deduplication table for the hash value if the lossless compressed data is not searched for;
reading data of a first address corresponding to the retrieved hash value in the memory device from the memory device if, as a result of the search, it is determined that the hash value is searched for;
comparing the program data with the read data; and
mapping a first address mapped to the hash value to the first address if, as a result of the comparison, it is determined that the program data is identical with the read data.

9. A method for controlling a memory, comprising:
converting received program data with a logical block address into compressed data;
searching a deduplication table including compressed data, a physical block address of a memory device in which non-compressed data corresponding to the compressed data has been written and a counter indicative of a write number of the data for the converted compressed data;
writing the program data in the physical block address of the memory device if the converted compressed data is not searched for in the deduplication table;
registering a new entry comprising the compressed data and the physical block address with the deduplication table, the compressed data comprising a hash value converted from the program data by a hash algorithm;
assigning a physical block address for writing the program data in the memory device if the program data and the read data are different;
writing the program data in the assigned physical block address of the memory device;
mapping the physical block address to the logical block address;
additionally registering a new entry comprising the hash value and the physical block address with the deduplication table;

selecting another physical block address mapped to a hash value having a counter value of next priority if the read data is different from the program data;
reading data written in said another physical block address of the memory device; and
comparing the read data with the program data.

10. The method of claim 9, wherein the updating of the deduplication table comprises:
reading data corresponding to the physical block address mapped to the retrieved hash value from the memory device if the hash value is searched for in the deduplication table; and
mapping the physical block address to the logical block address and increasing a counter value of a corresponding entry if the received program data is identical with the read data.

11. The method of claim 10, further comprising programming data into the memory device,
wherein the programming of the data comprises:
assigning a physical block address for writing the programmed data in the memory device if the programmed data and the read data are different;
writing the programmed data in the assigned physical block address of the memory device; and
mapping the assigned physical block address to the logical block address.

12. The method of claim 10, further comprising:
when an erase command is generated, checking a physical block address mapped to a logical block address of erase data, and
updating information about a corresponding entry if, as a result of the check, it is determined that the physical block address has been registered with the deduplication table.

13. The method of claim 12, wherein the updating of the information about the corresponding entry comprises:
checking a counter value of an entry with which the physical block address has been registered if an erase type is erase/trim;
decreasing the counter value of the entry if, as a result of the check, it is determined that the counter value is 2 or higher; and
deleting the entry and erasing the data written in the physical block address of the memory device if, as a result of the check, it is determined that the counter value is 1.

14. The method of claim 12, wherein the updating of the information about the corresponding entry comprises:
writing data in a changed physical block address of the memory device if the erase type is a garbage collection; and
updating the deduplication table by registering the changed physical block address with a corresponding entry of the deduplication table.

* * * * *